(12) United States Patent
Hosokawa

(10) Patent No.: US 6,460,369 B2
(45) Date of Patent: Oct. 8, 2002

(54) CONSECUTIVE DEPOSITION SYSTEM

(75) Inventor: Akihiro Hosokawa, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/753,424

(22) Filed: Jan. 3, 2001

(65) Prior Publication Data

US 2001/0015074 A1 Aug. 23, 2001

Related U.S. Application Data

(63) Continuation-in-part of application No. 09/432,544, filed on Nov. 3, 1999.

(51) Int. Cl.[7] .............................................. F25D 25/04
(52) U.S. Cl. .......................................... 62/378; 62/380
(58) Field of Search ..................... 62/378, 380; 118/719

(56) References Cited

U.S. PATENT DOCUMENTS 5,850,071 A * 12/1998 Makiguchi et al. ......... 219/390
6,051,371 A * 4/2000 Mita et al. .................. 430/330
6,117,266 A * 9/2000 Horzel et al. ............... 156/345
6,214,706 B1 * 4/2001 Madan et al. ............... 438/482

* cited by examiner

Primary Examiner—Denise L. Esquivel
Assistant Examiner—Malik N. Drake
(74) Attorney, Agent, or Firm—Moser, Patterson & Sheridan

(57) ABSTRACT

An apparatus and method for processing substrates is provided, wherein the apparatus includes at least one substrate carrier for transporting a substrate within a processing environment. At least one temperature controlled plate positioned in the processing environment is selectively in communication with the at least one substrate carrier and is used to both transfer substrates from an external substrate shuttle to the substrate carrier in the processing environment and to regulate the temperature of the processing environment. At least one deposition device configured to deposit a selected film on the substrate and an annealing device are positioned proximate the at least one substrate carrier within the processing environment.

46 Claims, 19 Drawing Sheets

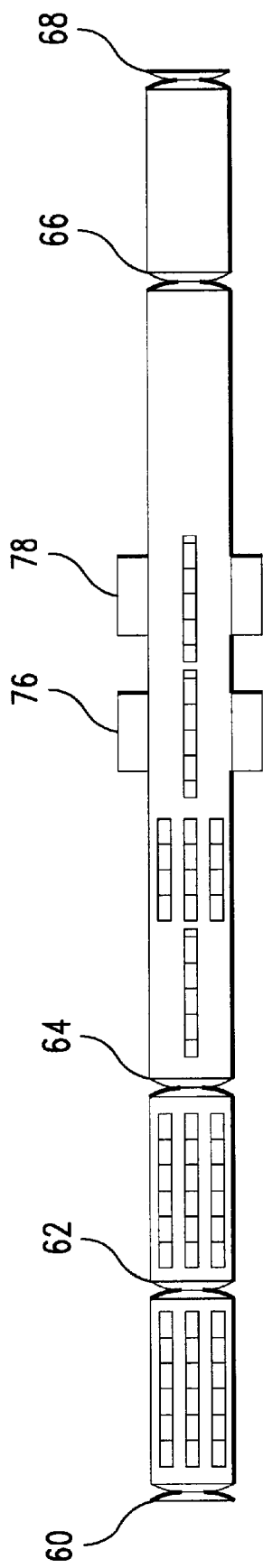
FIG. 5 (PRIOR ART)
FIG. 3 (PRIOR ART)
FIG. 4 (PRIOR ART)

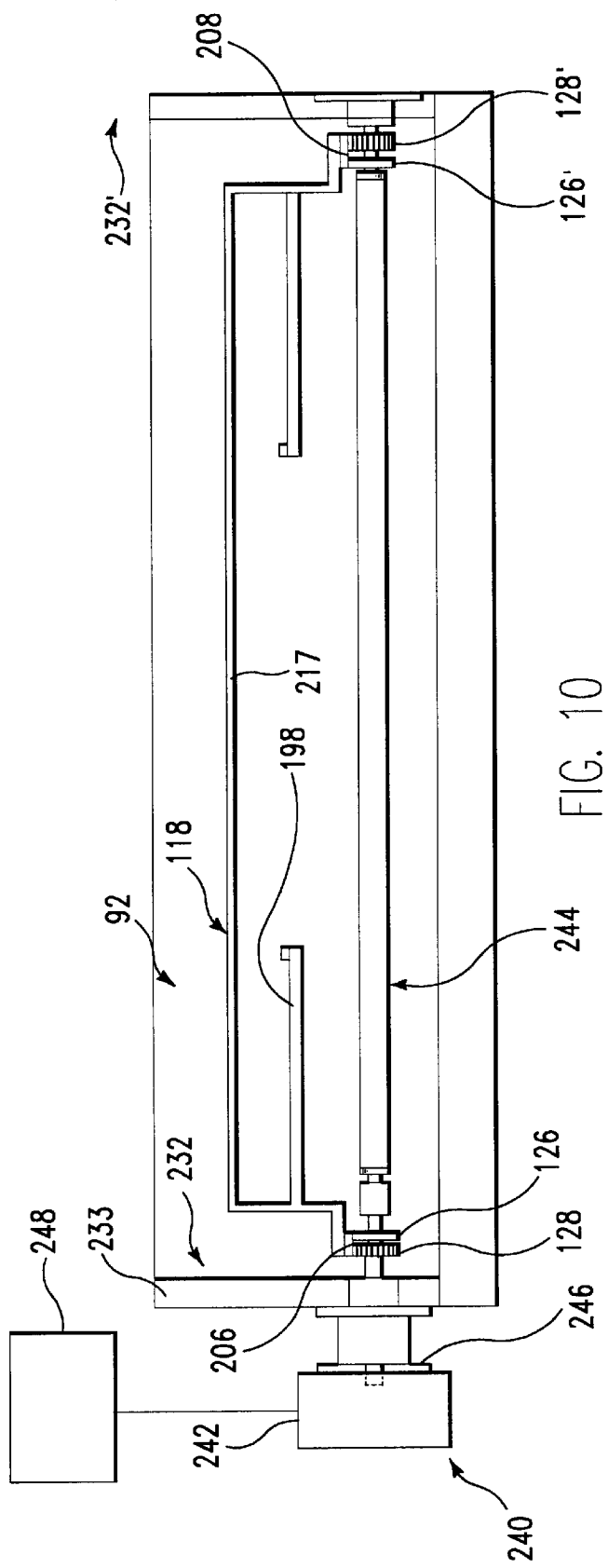
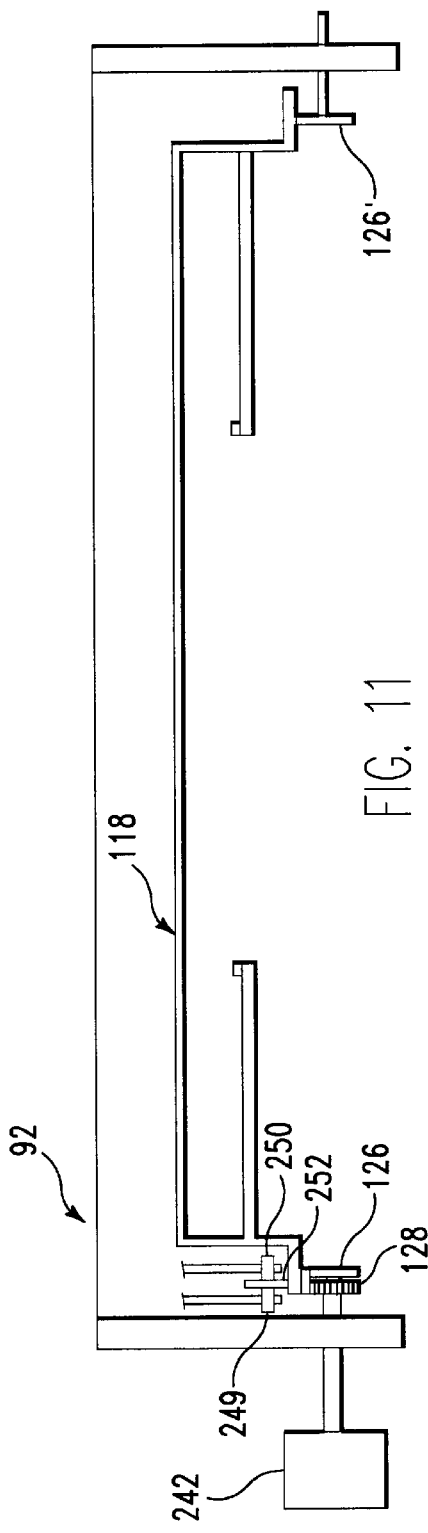
FIG. 10
FIG. 11

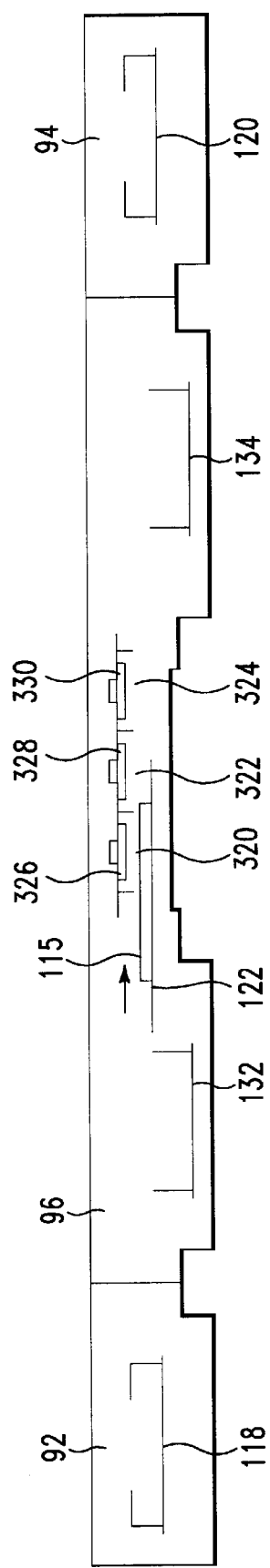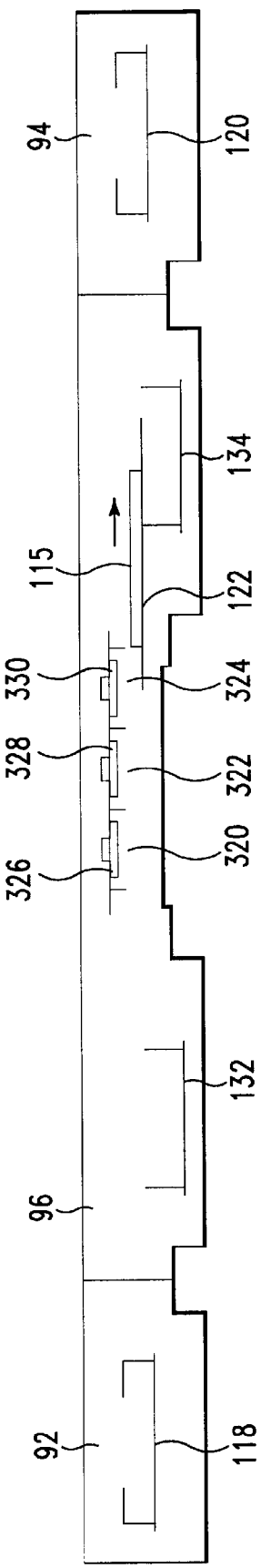

CONVENTIONAL METHOD TO PRODUCE POLY SILICON FILM

| # | METHOD | MATERIAL | THICKNESS (A) | NOTE |
|---|---|---|---|---|
| 1 | CVD | SiO2 | 3000 | |
| 2 | CVD | AMORPHOUS SILICON | 300-500 | THE SAME CVD TOOL CAN BE USED |
| 3 | EXCIMER LASER | POLY SILICON | 300-500 | DIFFERENT TOOL. EXPOSURE TO ARM AND PARTICLE. |
| | | | | |

FIG. 24

METHOD TO PRODUCE POLY SILICON FILM

| # | METHOD | MATERIAL | THICKNESS (A) | NOTE |
|---|---|---|---|---|
| 1 | PVD | SiO2 | 3000 | |
| 2 | PVD | AMORPHOUS SILICON | 300-500 | THE SAME PVD TOOL CAN BE USED |
| 3 | EXCIMER LASER | POLY SILICON | 300-500 | EXCIMER LASER INSTALLED AT THE END OF PVD PROCESS |
| | | | | |

FIG. 26

CONSECUTIVE DEPOSITION SYSTEM

RELATED APPLICATIONS

This application is a continuation in part (CIP) of copending U.S. patent application Ser. No. 09/432,544 filed on Nov. 3, 1999. The contents of this earlier filed application are hereby incorporated by reference.

BACKGROUND OF THE INVENTION

1. Field of the Invention

The present invention relates to the field of semiconductor processing. More particularly, the present invention relates to an apparatus and method for transporting substrates through a semiconductor processing system, wherein the apparatus and method include a temperature control mechanism. Further, the present invention relates to an apparatus and method for transporting substrates through a semiconductor processing system to generate a poly silicon film.

2. Background of the Related Art

In the semiconductor industry, there are generally two primary methods of transporting substrates through a processing system. One traditional method uses a "cluster tool" configuration, as shown in FIG. 1. A cluster tool platform generally refers to a modular, multi-chamber, integrated processing system. This type of processing system typically includes central wafer handling vacuum chambers 20, 32, and a number of peripheral processing chambers 24, 26, 28, and 36, which are generally arranged in a cluster around the central chambers. Multiple substrates or wafers 22 for processing are generally stored in cassettes 10, and are loaded/unloaded from load locks 12, 14 and processed under vacuum in various processing chambers without being exposed to ambient conditions. The transfer of wafers 22 for the processes is generally managed by a centralized robot 16 in a wafer handling vacuum chamber 20 or robot 30 in a second wafer handling vacuum chamber 32, both of which are generally maintained under vacuum conditions. A microprocessor controller 38 and associated software is provided to control processing and movement of wafers. In operation, a cluster tool configuration will generally receive a substrate from a cassette 10 and process the substrate through a predetermined sequence of central wafer handling chambers 20, 32 and peripheral processing chambers 24, 26, 28, and 36 in order to generate the desired material and pattern on a wafer, which is then returned to a cassette 10.

Although cluster tool configurations are generally preferred for processing relatively small substrates, a second method of processing substrates known as an "inline" system is generally preferred for processing larger substrates. These larger substrates, which may be formed on glass, ceramic plates, plastic sheets, or disks, for example, are often used in the manufacture of flat panel type displays in the form of active matrix televisions, computer displays, liquid crystal display (LCD) panels, and other displays. A typical glass substrate supporting a common flat panel type display may have dimensions of approximately 680 mm by 880 mm. For other display applications, the size of the substrate may be substantially larger, as required to support the particular size of the display.

FIG. 2 is a schematic side view of a typical modular inline system 40. This type of processing system generally includes a serial or inline arrangement of processing chambers 42, 44 disposed between a load chamber 46 and an unload chamber 48. An elevator 50 is positioned at an entry to load chamber 46 and another elevator 52 is positioned at an exit from unload chamber 48. Processing chambers 42, 44 may include deposition chambers, such as chemical vapor deposition (CVD) chambers, physical vapor deposition (PVD) chambers, etch chambers, and/or other deposition and processing chambers. A carrier return line 58 is positioned above processing chambers 42, 44 and coupled to the elevators 50, 52. Processing chambers 42, 44 are typically held under vacuum or low pressure and are separated by one or more isolation valves 60, 62, 64, 66, and 68, as shown in FIG. 3. Typically, multiple substrates 54, 56, 70, 72 are supported by a carrier 74, as shown in FIGS. 4 and 5. Isolation valves 60, 62, 64, 66, and 68 are generally configured to seal the respective chambers from each other in a closed position and allow substrates 54, 56 to be transferred through the valves to an adjacent station in an open position.

Carrier 74, shown in FIG. 2, is placed adjacent elevator 50, where substrates 54, 56, 70, 72 are manually loaded onto carrier 74 at receiving station 51. A door to the elevator 50 (not shown) opens and allows carrier 74 to be placed within the elevator on a track (not shown). The temperature and pressure inside elevator 50 is typically at ambient conditions. Isolation valve 60 opens and allows carrier 74 to be moved on the track into load chamber 46. Load chamber 46 is sealed and pumped down to a vacuum typically in a range of about 10 mTorr to about 50 mTorr for CVD processing and about 1 mTorr to about 5 mTorr for PVD processing. Another isolation valve 62 is opened and carrier 74 is moved into a processing chamber 42, where the substrates may be heated to a temperature suitable for processing. Another isolation valve 64 is opened and carrier 74 is moved along the track into processing chamber 44. If processing chamber 44 is a sputtering process chamber, the chamber could include a plurality of targets 76, 78 that sputter material from the surface of the targets facing the substrates onto substrates 54, 56, 70, 72 as the substrates move along the track adjacent each target. Each sputtering target is bombarded on the side facing the substrate with ionized gas atoms (ions) created between an anode (typically the target) and a cathode (typically the grounded chamber wall) and atoms of the target are dislodged and directed toward the substrates for deposition on the substrates. Each target preferably has a magnet (not shown) disposed on the back side of the target away from the substrates to enhance the sputtering rate by generating magnetic field lines generally parallel to the face of the target, around which electrons are trapped in spinning orbits to increase the likelihood of a collision with, and ionization of, a gas atom for sputtering. Substrates 54, 56, 70, 72 are then moved to an unloading chamber 48 through isolation valve 66. Isolation valve 66 closes, thereby sealing processing chamber 44 from unload chamber 48. Isolation valve 68 opens and allows carrier 74 to be removed from unloading chamber 48 and substrates 54, 56, 70, and 72 are typically unloaded manually from carrier 74. The substrates can also be detained in the unloading chamber to allow time for the substrates to cool. After the substrates have been unloaded, carrier 74 enters elevator 52, whereupon elevator 52 lifts carrier 74 to carrier return line 58. A track system (not shown) in carrier return line 58 returns the carrier to elevator 50, which lowers the carrier into position at receiving station 51 on the other end of the processing system to receive a next batch of substrates to be processed.

While the inline system 40 is currently used for substrate transportation and production, this type of inline system has several disadvantages. In particular, carrier 74 is subject to thermal cycling as a result of the movement of carrier from the processing environment (under vacuum) to an ambient environment in elevators 50, 52, and then back into the processing environment. As a result of thermal cycling, deposition material is likely to peel off or be otherwise dislodged from carrier 74 and cause unwanted particle contamination on the substrates. Additionally, the use of the exposed track system, both within the processing chambers and in the ambient areas of the system, is subject to generating contaminants. Further, the use of the elevators and a track system adds a level of complexity to the system, which results in additional maintenance of the various moving components in order to avoid breakdowns. Further still, as a result of carrier 74 cycling through vacuum environments and ambient atmospheric pressure, carrier 74 is prone to absorb gases from the surrounding conditions in the ambient environment, which inevitably increases the chamber pressure and causes contamination of deposited film layers when the gasses absorbed in the ambient atmospheric environment outgass from carrier 74 into the vacuum environment. In addition to the thermal cycling of carrier 74, the mean temperature of carrier 74 typically rises as multiple sets of substrates are processed therewith at temperatures above ambient conditions in the processing environment. Since most processes in processing chambers are temperature sensitive, this rise in carrier temperature increases the probability that the resulting deposition process will produce inconsistent films, as heat transfer from carrier 74 may affect the substrate and/or process properties. This unmonitored variance in the substrate temperature may result in films created at the beginning of a production cycle varying from films created at the end of the production cycle. Yet another challenge with a typical inline system is cross contamination between processes in adjacent processing chambers, especially those chambers using a reactive deposition process. Reactive processing generally depends on two or more constituents in proper proportions, and therefore, an influx of constituents from adjacent processing regions may cause the reactive processing to be unstable and/or adversely affect the deposition characteristics on one or both processing regions.

Therefore, in view of the plain disadvantages resulting from present inline processing systems, there remains a need for an improved inline system and method for processing substrates. In particular, there is a need for an improved inline system capable of processing relatively large and flat substrates though multiple inline deposition regions. Furthermore, there is a need for an inline processing system capable of processing substrates of sufficient size to support large flat panel displays.

SUMMARY OF THE INVENTION

The present invention generally provides a system for processing substrates having a carrier disposed primarily in at least one processing chamber and at least one shuttle for transferring substrates between the processing chamber and a load lock chamber. A plurality of processing chambers, load lock chambers, and other chambers can be joined to create a substantially inline series of modular chambers through which substrates are processed. The carrier of the present invention is generally only exposed to the processing environment, i.e., the carrier generally does not shuttle into a non-processing chamber. Therefore, during continuous sequential processing of substrates, thermal cycling of the carrier will be reduced and possibly eliminated. The carrier is reversibly moved within the processing chamber along a concealed track. Multiple processing zones separated by partitions allow a plurality of processing regimes to occur within the same processing chamber without interference. Further, the operating temperature of the carrier in the present invention is temperature controlled by one or more temperature-controlled plates designed to radiate and/or absorb heat to/from the carrier in order to achieve a predefined carrier temperature.

In one embodiment, the present invention provides an apparatus for processing substrates, wherein the apparatus includes at least one substrate carrier for transporting a substrate within a processing environment, at least one temperature controlled plate selectively in communication with the at least one carrier, and at least one deposition device positioned proximate the at least one substrate carrier. The at least one deposition device generally being configured to deposit a selected film upon the substrate.

In another embodiment, the present invention provides a method for processing substrates, wherein the method includes the steps of transporting a substrate into a processing environment on at least one substrate carrier, and transferring the substrate to a substrate support plate inside the processing environment. Further steps of transporting the substrate support plate having the substrate thereon through at least one processing zone in the processing environment and transferring the substrate from the substrate support plate to the at least one substrate carrier for removal from the processing environment are also provided.

In another embodiment, the present invention provides a method for producing a poly silicon film, wherein the method includes the steps of loading a substrate into a processing environment, exposing the substrate to at least one deposition source in the processing environment, exposing the substrate to an annealing device in the processing environment, and removing the substrate from the processing environment. Further, the method includes the step of maintaining and/or controlling the temperature of a substrate through the use of one or more temperature controlled plates.

BRIEF DESCRIPTION OF THE DRAWINGS

So that the manner in which the above recited features, advantages, and objects of the present invention are obtained and can be thoroughly understood, a more particular description of the invention briefly summarized above may be had through reference to exemplary embodiments thereof, which are illustrated in the appended drawings.

It is to be noted, however, that the appended drawings illustrate only exemplary embodiments of the present invention and are therefore, not to be considered limiting upon the scope of the present invention, as the present invention may admit to other equally effective embodiments.

FIG. 3 is a schematic top view of the chambers in the inline system shown in FIG. 2.

FIG. 4 is a schematic side view of a substrate carrier in the inline system.

FIG. 5 is a schematic end view of a substrate carrier in the inline system.

FIG. 10 is a schematic of another chamber cross section showing a pinion.

FIG. 11 is a schematic of an alternative embodiment of the drive mechanism shown in FIG. 10.

FIGS. 19–23 are schematic diagrams of an exemplary process sequence.

FIG. 24 illustrates an example method for creating conventional poly silicon films.

FIG. 26 illustrates a method to produce a poly silicon film.

DETAILED DESCRIPTION OF THE PREFERRED EMBODIMENT

The present invention generally provides a consecutive inline processing system having one or more interconnected chambers and a substrate carrier disposed in the system to support and transfer a substrate through the one or more chambers. The alignment of the respective chambers is generally linear, however, various series type configurations, such as, for example a continuous circle or oval, are expressly contemplated within the scope of the present invention. In one aspect, the invention includes loading and unloading load lock chambers positioned at opposing ends of a processing system. A transfer shuttle may be disposed in each load lock chamber to transfer substrates to and from the substrate carrier in the processing system. Also, reactive processes and non-reactive processes can be performed in a single processing chamber through use of partitions between processing zones in the processing chamber. The partitions allow the reactive processing to occur without the traditional isolation valves between each discrete process.

Figure 6:
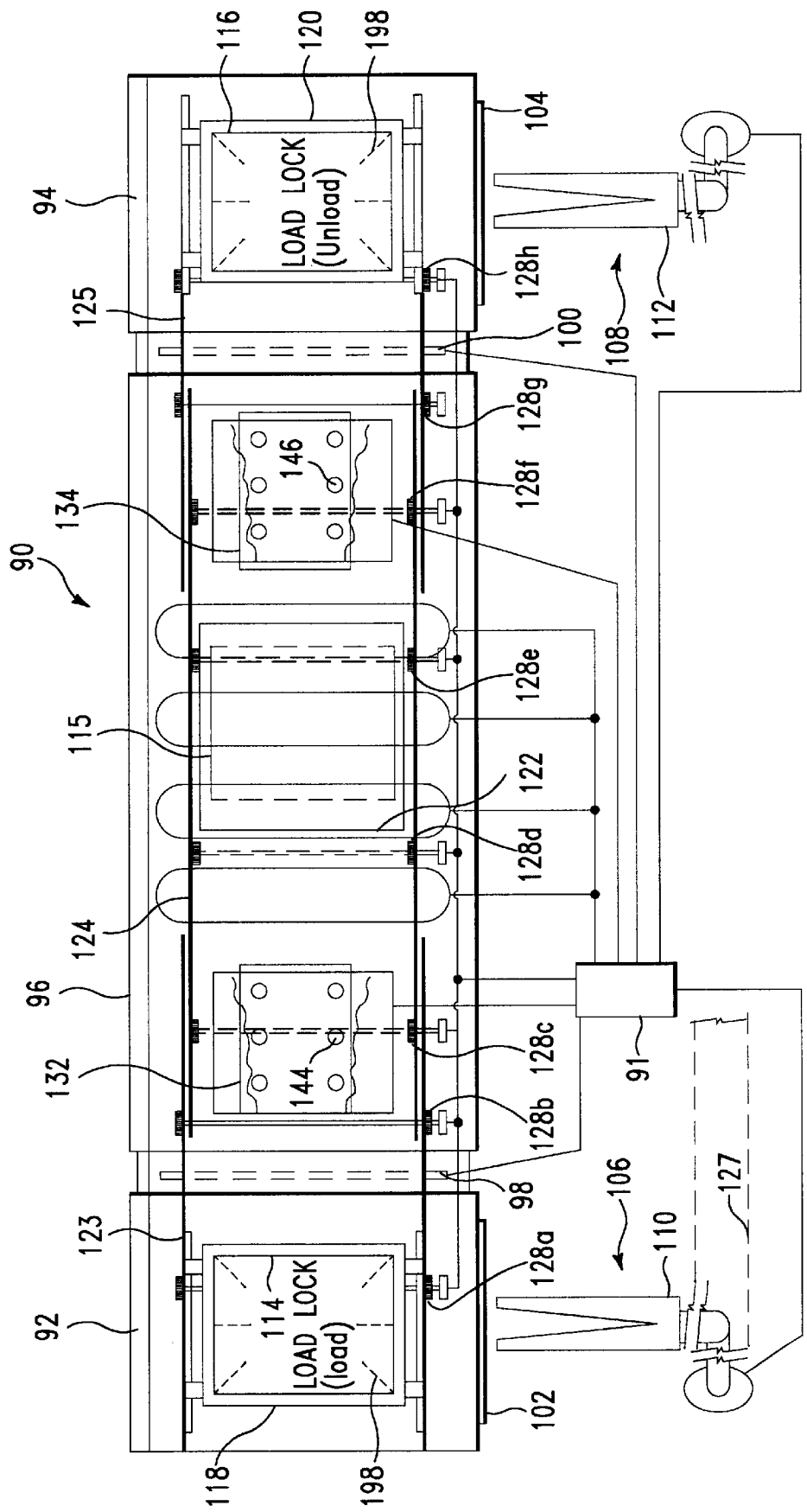
FIG. 6 is a schematic top view of a consecutive deposition inline system of the present invention.
Figure 7:
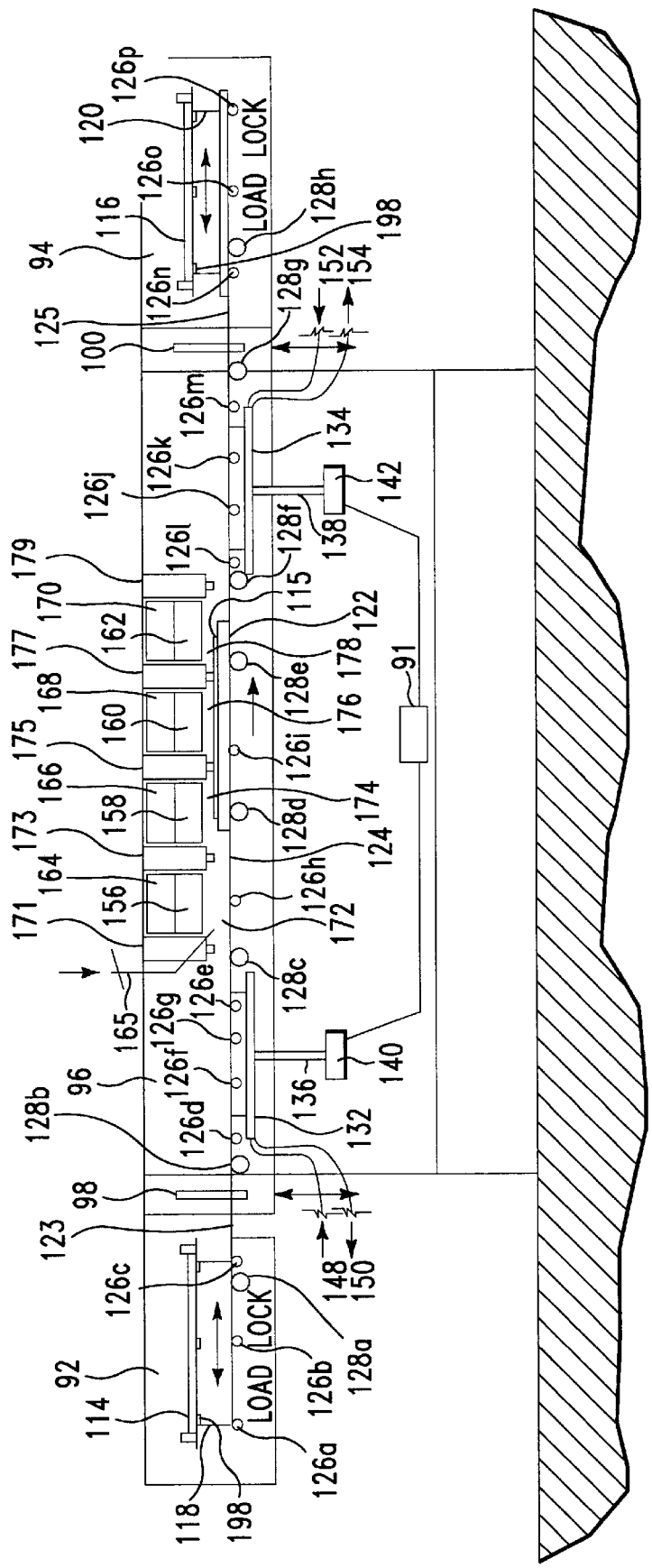
FIG. 7 is a schematic side view of the consecutive deposition inline system shown in FIG. 6.

FIGS. 6 and 7 respectively illustrate top and side views of an exemplary linear consecutive deposition system 90. System 90 includes entry load lock chamber 92 on one end, exit load lock chamber 94 disposed at the other end, and at least one continuous process chamber 96 generally occupying the space therebetween. Entry load lock chamber 92 is selectively isolated from process chamber 96 through activation of isolation valve 98. Entry load lock chamber 92 may also include a valve 102 that opens to a receiving station 106 that is serviced by a robot 110. Robot 110 operates to deliver a substrate 114 to entry load lock chamber 92. Similarly, exit load lock chamber 94 may be selectively isolated from process chamber 96 through activation of isolation valve 100. Exit load lock chamber 94 may also include a valve 104 that opens to a receiving station 108 that is serviced by another robot 112. Therefore, robot 112 may operate to retrieve one or more substrates 114 from exit load lock chamber 94. Alternatively, the system may include a track type robot that services both load lock chambers by moving along a track disposed adjacent the respective chambers. The robot is generally referred to as an atmospheric robot and models are commercially available from such manufacturers as MECS, RORTZ, JEL, Daihen, Komatsu and other well-known manufactures.

At least one shuttle 118 may be positioned in entry load lock chamber 92 and at least one other shuttle 120 may be positioned in exit load lock chamber 94. Shuttles 118 and 120 are movable in and out of load lock chambers 92 and 94 into processing chamber 96 through use of one or more reversible motors and/or gear assemblies. This movement enables shuttles 118 and 120 to transfer a substrate into or out of processing chamber 96, and subsequently retract from the processing chamber into their respective load lock chambers. At least one carrier 122 is continually positioned within in the process chamber 96, i.e, carrier 122 generally remains within process chamber throughout the loading, deposition, and unloading processes. Carrier 122, which is generally used to support a substrate during the deposition process, is typically movable in both directions, i.e., reversible in the direction of both entry load lock chamber 92 and exit load lock chamber 94 or transversely within processing chamber 96. Further, carrier 122, which operates as a substrate receiving member, has a substrate receiving surface for engaging/holding a substrate on a top portion of the receiving member and a drive engaging member on a bottom portion of the receiving member, both of which will be further discussed herein.

In the present exemplary embodiment shown in FIGS. 6 and 7, three tracks are disposed in the system 90 for movement of shuttles 118, 120 and carriers 122. Each track generally includes a plurality of guide rollers 126a–p (generally referred to herein as guide roller 126) and pinion gears 128a–h (generally referred to herein pinion 128). Tracks 123 and 125 support movement of shuttles 118 and 120 between process chamber 96 and their respective load lock chambers. A third carrier track 124 supports carrier 122 for movement within process chamber 96. Aligning a plurality of guide rollers and/or pinion gears may form the tracks, and may be configured to include side guide rails (not shown). The quantity of guide rollers 126 and pinion gears 128 along each track may vary depending on factors such as the length of the chambers, the length of the shuttles and carrier, and the size of the substrate. Shuttle track 123 is disposed in entry load lock chamber 92 and extends into processing chamber 96, thereby allowing shuttle 118 to transport substrate 114 into processing chamber 96. Shuttle track 123 generally includes guide rollers 126 and pinion gears 128 disposed in the lower portion of system 90 and provides a path for movement of shuttle 118 between chambers 92 and 96. Similarly, another shuttle track 125 is generally positioned in exit load lock chamber 94 and extends into processing chamber 96. Shuttle track 125 includes a plurality of guide rollers 126 and pinion gears 128, and provides a path for movement of shuttles between chambers 94 and 96. Carrier track 124 generally extends between the isolation valves 98 and 100, and therefore, provides a continuous path for movement of carrier 122 within chamber 96 as substrates are processed. Carrier track 124 is generally narrower in width than shutffle tracks 123 and 125 and includes a plurality of guide rollers 126 and pinion gears 128. The narrower width of carrier track 124 allows carrier 122 to be positioned under the shuttles 118 and 120 for a substrate transfer between the shuttle and the carrier. Guide rollers 126 and pinion gears 128 may be spaced along tracks 123, 124, 125 at appropriate intervals so that each rail on carrier 122 and shuttles 118 and 120 is supported on at least at two points as the carrier and shuttles are moved along their respective tracks. Although carrier track 124 is shown as a track with a different width, i.e., spacing between the track rails, than shuffle tracks 123 and 125, various other configurations and mechanisms may be used for delivering substrates between load lock chambers 92 and 94 and processing chamber 96. For example, alternatives to the tracks may be cantilevered assemblies, robots and V-shaped shuttles and/or carriers similar to the robot blades of robots 110, 112.

Figure 13A:
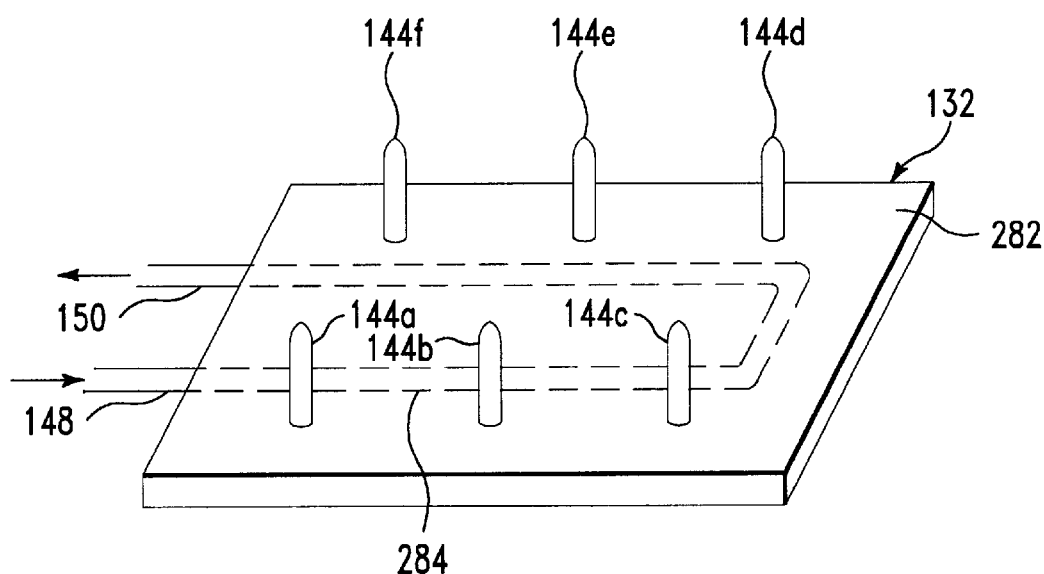
FIG. 13a is a schematic perspective view of a pin plate having a fluid system therein.
Figure 13B:
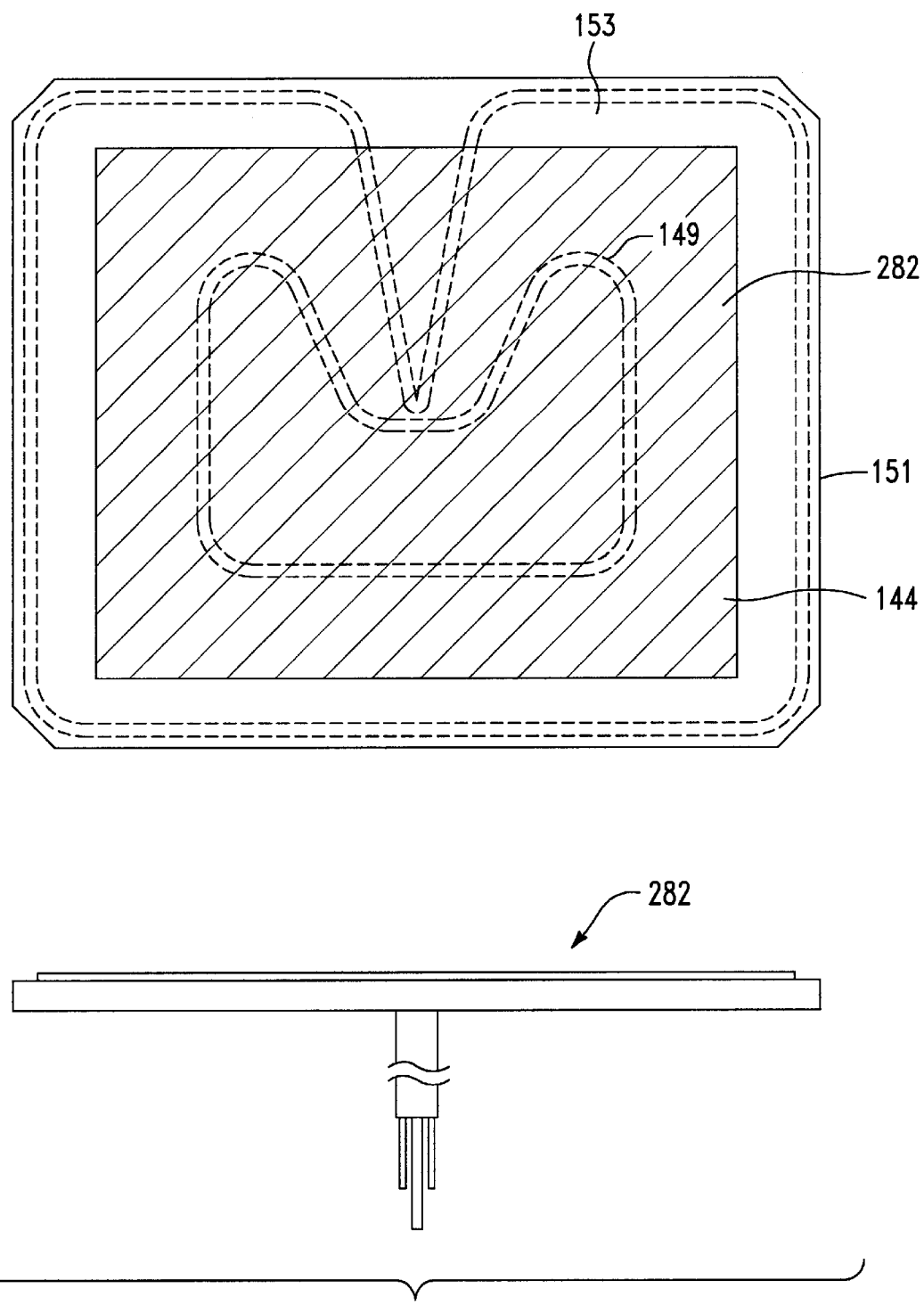
FIG. 13b is a schematic perspective view of a pin plate having a heater therein.

A pin plate 132 is positioned proximate the loading end of process chamber 96 adjacent entry load lock chamber 92. Pin plate 132 is generally manufactured from a heat conductive material, such as aluminum or copper. Pin plate 132 is generally coupled to a shaft 136 and a lift motor 140, which operates to facilitate selective movement of pin plate 132. A plurality of pins 144 extend in a generally orthogonal direction from an outer surface of pin plate 132. Further, the temperature of pin plate 132 may be controlled through the use of, for example, an exothermic mechanical/chemical device and/or an internally flowing endothermic/exothermic fluid received through coolant inlet line 148 and outlet line 150, as generally shown in Figures 13a, 13b, 15, and 16. FIG. 13a illustrates an exemplary pin plate 132 having a fluid passage formed therein for receiving a flowing fluid therethrough, which may be used to remove heat from pin plate 132, assuming that the temperature of the fluid is less than the temperature of pin plate 132. FIG. 13b illustrates an exemplary pin plate 132 having an inner heater 149, an outer heater 151, and a thermocouple 153, which may cooperatively operate to raise the temperature of pin plate 132, if desired. This increase in temperature may be used to increase the temperature of either substrate 114 or carrier 122, for example, in order to create the desired processing parameters within chamber 96. Further, if desired, both heaters 149 and the fluid channel interconnecting inlet 148 and outlet 150 for pin plate 132 may be used in cooperation to selectively heat and/or cool pin plate 132. The fluid channel may connect to inlet 148 and outlet 150 via vacuum compatible connectors, such as those available under the trademarked names Swagelock® and VCR®. Further, the inlet and outlet lines connecting the fluid channel to a source and drain for the fluid to be passed through the channel may be connected directly to pin plate 132. Alternatively, the fluid supply and drain lines may be routed through an interior portion of shaft 136 to pin plate 132. Additionally, heating or cooling of pin plate 132 may be used to increase or decrease the ambient temperature in processing chamber 96. Further, although the fluid passage illustrated in FIG. 13a is described for use with a cooling fluid, the fluid passage may be used to receive a fluid with a temperature greater than that of pin plate 132, thereby heating pin plate 132 and/or the surrounding chamber components and/or substrates. Additionally, although FIGS. 13a and 13b illustrate exemplary heater and cooling fluid passage configurations, various alternative configurations and/or devices for the heaters and fluid passages are contemplated within the scope of the present invention.

Pin plate 134, which is similar in structure to pin plate 132, is disposed at the opposite end of process chamber 96 from plate 132 adjacent exit load lock chamber 94. Pin plate 134 is coupled to a shaft 138 and a lift motor 142, and again includes a plurality of pins 146 extending in a generally orthogonal direction from plate 134. Similarly, the temperature of pin plate 134 may be controlled through the use of an exothermic device and/or an internally flowing endothermic fluid through inlet line 152 and outlet line 154, as described with regard to plate 132. Therefore, once substrate 114 is loaded into processing chamber 96 on carrier 122, one or more temperature controlled plates 132, 134 may be used to both transfer substrates from shuttles to carriers (described below), while also operating to selectively regulate the temperature of the processing chamber and/or the substrate.

Figure 28:
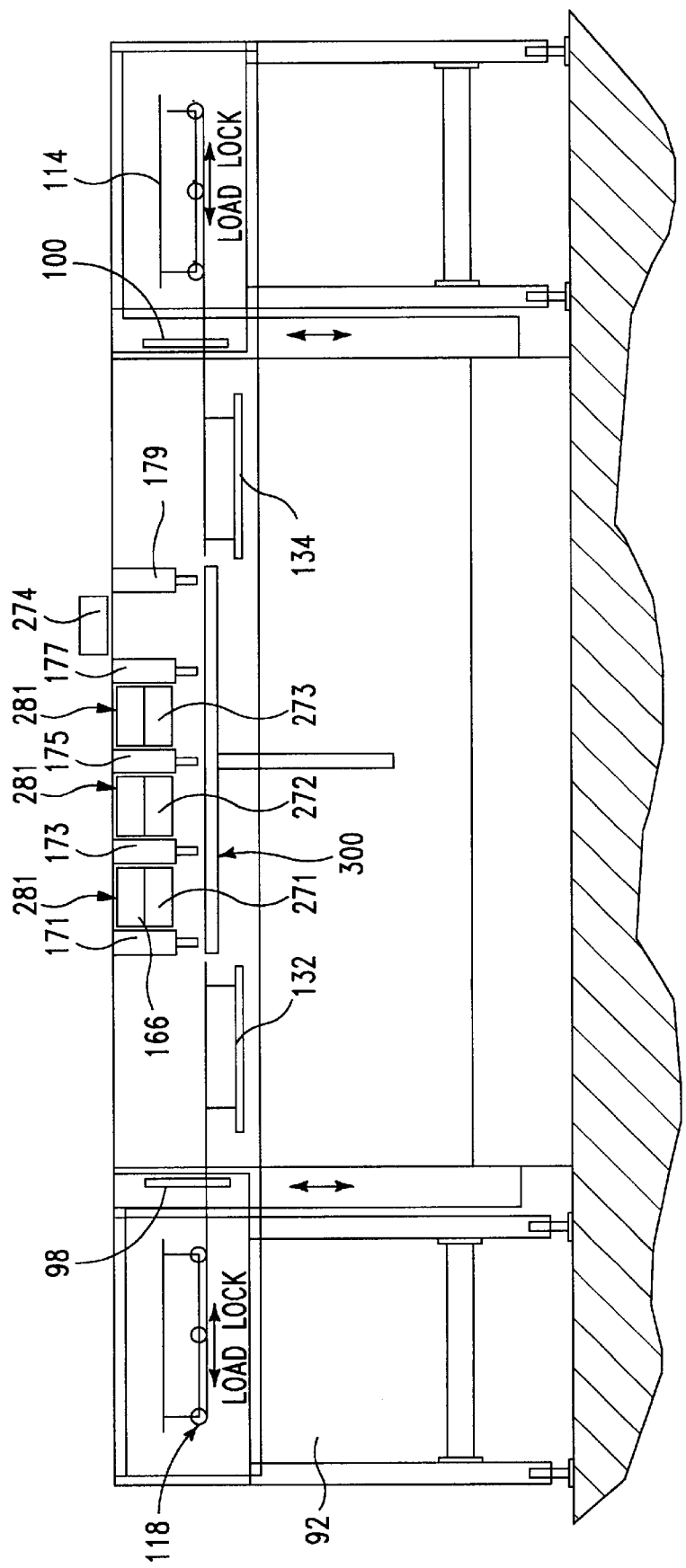
FIG. 28 illustrates a side view of an inline deposition system.

As shown in FIGS. 7 and 28, the processing chamber of the present exemplary embodiment may include one or more processing zones, wherein one or more processing environments may be maintained as the substrates are passed therethrough. For example, one or more targets 156, 158, 160, and 162 may be disposed above substrates 114 and/or carriers 122 in processing chamber 96 if, for example, processing chamber 96 is a sputtering chamber. Similarly, showerheads (not shown) for CVD or etch processing, along with other components necessary for other types of processing, may be positioned above substrate 114 and/or carrier 22 as processing configurations require. Partitions 171, 173, 175, 177, and 179 may be positioned proximate each of the targets 156, 158, 160, and 162 and at the non-adjacent sides of each of targets 156 and 162. Partitions 171, 173, 175, 177, and 179 are configured to physically separate each target from adjacent targets in order to define the series of processing zones, such as the four processing zones 172, 174, 176, and 178 within the processing chamber 96. Each zone may be shorter in length than the linear dimension of a substrate being carried therethrough, so that only a portion of the substrate, i.e., a full width and a partial length, is exposed to the process environment of a single zone at one time. Therefore, in the present exemplary configuration, substrate 114 may be simultaneously exposed to multiple processing zones at varying locations on substrate 114. For systems with more than one processing chamber 96, one or more processing zones can be included in each processing chamber.

The lower portions of processing zones 172, 174, 176, and 178 are generally open to the processing environment of processing chamber 96 so that a substrate being processed can move from one processing zone to another processing zone without necessitating entry into other processing chambers through isolation valves. Each partition generally extends to a position in close proximity to substrate 114 to be processed, which, for example, may be approximately 1 mm to about 5 mm away from substrate 114 as substrate 114 is being processed through chamber 96. Separation of this nature allows for transportation of substrates 114 between zones, while generally prohibiting elements from one processing zone from entering other zones and causing contamination. Further, one or more of the processing zones may be adapted to provide a reactive process by including one or more gas inlets 165 for introducing a reactive gas or gases into a particular processing zone. The same processing zone used for reactive processing may generally be used for non-reactive processing by not introducing reactive gases into the processing zone, assuming that gas inlets 165 and/or other reactive processing related components are appropriately positioned not to interfere with the components necessary for non-reactive processes.

As a result of substrate processing being conducted through a series of processing zones, for larger substrates in particular, isolation valve 98 adjacent the entry load lock chamber 92 may be partially opened in order to provide clearance for substrate 114 to move through more than one of processing zones 172, 174, 176, and 178, while still occupying the space proximate valve 98. Similarly, isolation valve 100 adjacent exit load lock chamber 94 may also be partially opened to provide additional longitudinal clearance for larger substrates to travel through chamber 96. Also, the speed or rate of transport of carrier 122 can be varied depending on whether substrate 114 is simply being longitudinally transferred from one end of the processing apparatus to another, being carried along track 124 to/from a processing zone, or being processed through a particular processing zone. The rate of travel of the substrate through a particular processing zone during processing is generally selected to yield the desired deposition thickness or completion of etching based on a multiplier of process rate(s) times the duration of each point on the substrate in the process region. The speed of carrier 122 through a deposition region may be, for example, in the range of approximately 5 mm/sec to 20 mm/sec during deposition and approximately 100 mm/sec to 200 mm/sec during transfer. Therefore, substrate 114 would travel at the speed specifically calculated to properly deposit the desired film thickness on substrate 114 while within a particular deposition region, however, when substrate 114 is no longer within a deposition region, the speed may be increased. This allows for greater efficiency, as substrates 114 may be quickly transported during non-deposition processes.

Figure 8:
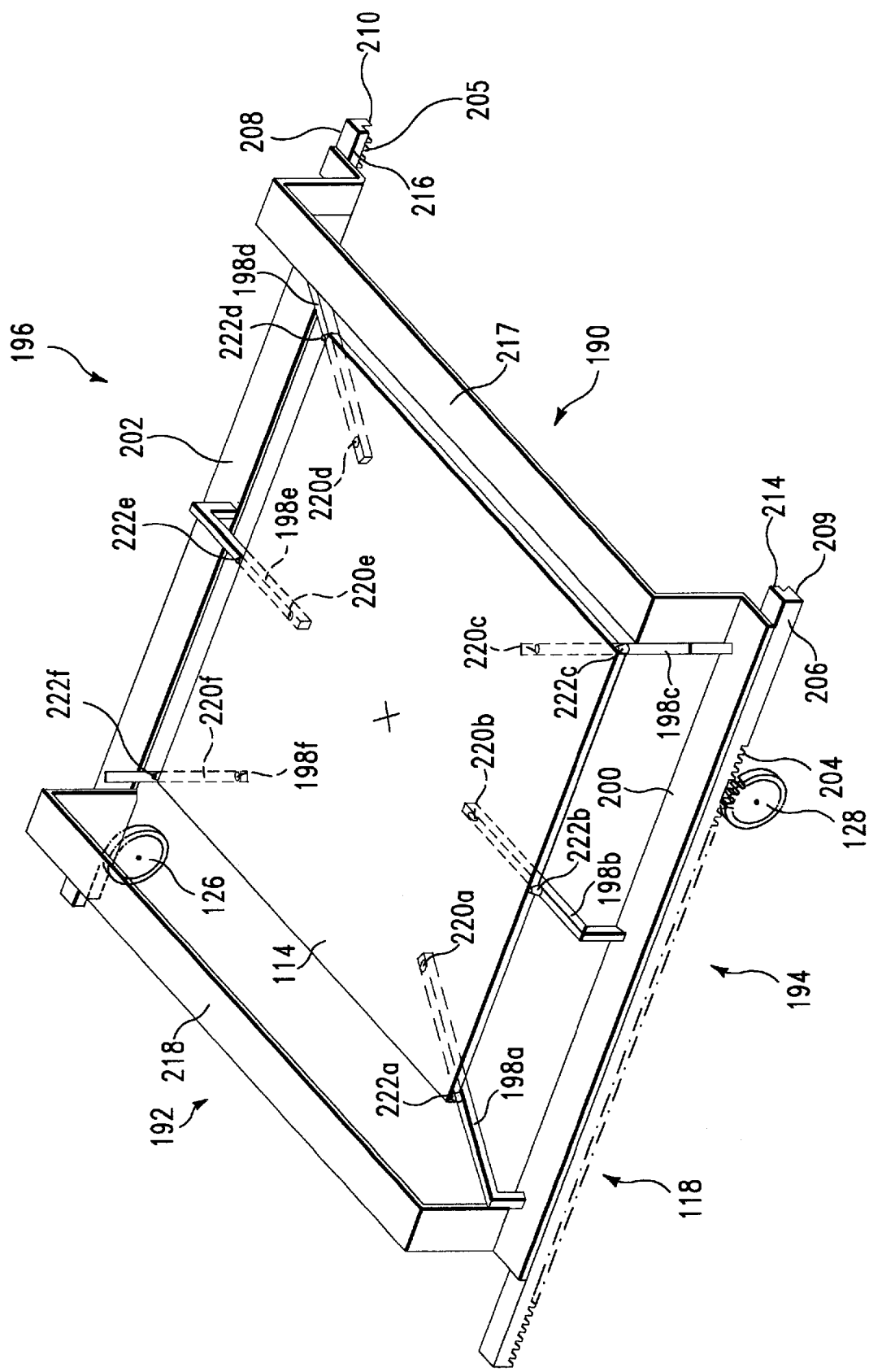
FIG. 8 is a schematic perspective view of a shuttle.

A controller 91 may be used to control various functions in the system such as the movements of the substrate carrier, pin plates, shuttles, pinions on the tracks, valves, and other associated system features. Controller 91 may include a programmable microprocessor configured to execute system control software stored in a memory, which may be in the form of a hard disk drive, and can include analog and digital input/output boards, interface boards, stepper motor controller boards (not shown), and other known control components. Controller 91 may also control electrical power to components of the system and may include a panel that allows an operator to monitor and vary the operation the system. Optical and/or magnetic sensors (not shown) may generally be used to move and determine the position of movable structures and assemblies in cooperation with controller FIG. 8 is a schematic perspective view of an exemplary shuttle 118 that may be positioned in each of entry and/or exit load lock chambers 92, 94. Each shuttle 118 generally includes a first end 190 and a second end 192 opposite first end 190, along with a first side 194 and a second side 196. A plurality of support fingers 198a–f (generally referred to herein as support fingers 198) generally extend inwardly from an outer periphery of shuttle 118, such as transverse to or at angles to the sides 194, 196 and ends 190, 192. Each shuttle may include a first side rail 200 along first side 194 and a second side rail 202 along the second side 196. The side rails 200, 202 are generally parallel to and spaced apart from each other by cross members 217, 218. Cross members 217 and 218 are generally spaced from the fingers 198 by a distance greater than the thickness of a substrate processed in the system to allow pin plates 132, 134 to lift substrate 114 from support fingers 198. Thereafter, shuttles 118, 120 may retract from the respective pin plate 132, 134 while the respective pin plate 132, 34 continues to support substrate 114. As such, substrate 114, upon transfer from shuttle 118 to carrier 122, will be lifted from fingers 198 and transported under one of cross members 218 and 217, such that substrate 114 is completely removed from support by shuttle 118 and placed upon carrier 122. Side rails 200 and 202 of shuttle 118 may include toothed racks 206 and 208 on lower surfaces 209, 210, respectively for imparting motion to shuffle 118. Toothed racks 206 and 208 include teeth 204 and 205, respectively, which are adapted to engage a rotating pinion gear 128. Inward stepped surfaces 214, 216 on each respective rail are adapted to engage an enclosed guide roller 126, as shown in FIG. 9.

The ends of the support fingers 198 may include one or more support pads 220a–f (generally support pads 220) that extend upward from the fingers and upon which the substrate 114 is supported. Finger guides 222a–f (generally finger guides 222) are disposed outwardly from the support pads 220 and form a surface against which substrate 114 can be laterally positioned. Support fingers 198 are positioned on shuttle 118 to allow pins 144 in pin plate 132 to engage and support substrate 114 above fingers 198. Upon engagement of substrate 114 by pins 144, shuttle 118 may be retracted from the processing chamber 96 leaving substrate 114 supported by pins 144. Therefore, the lower portions of support fingers 198 and cross members 217, 218 are generally positioned at a higher elevation than an upper substrate receiving surface of carrier 122, shown in FIG. 6, which allows shuttle 118 to be positioned over carrier 122 for substrate transfer. Shuttle 118 may be exposed to temperatures of about 600° C. or more and, thus, shuffle 118 may be manufactured of stainless steel, ceramics, Invar 36®, or other temperature resistant materials suitable for film deposition process environments. Similarly, support pads 220 are preferably made of material such as ceramic, stainless steel, quartz, or other temperature resistant materials. Although the above description is generally directed to shuttle 118 in entry load lock chamber 92, the corresponding shuttle 120 positioned in exit load lock chamber 94 is similar in design and construction to shuttle 118.

Figure 9:
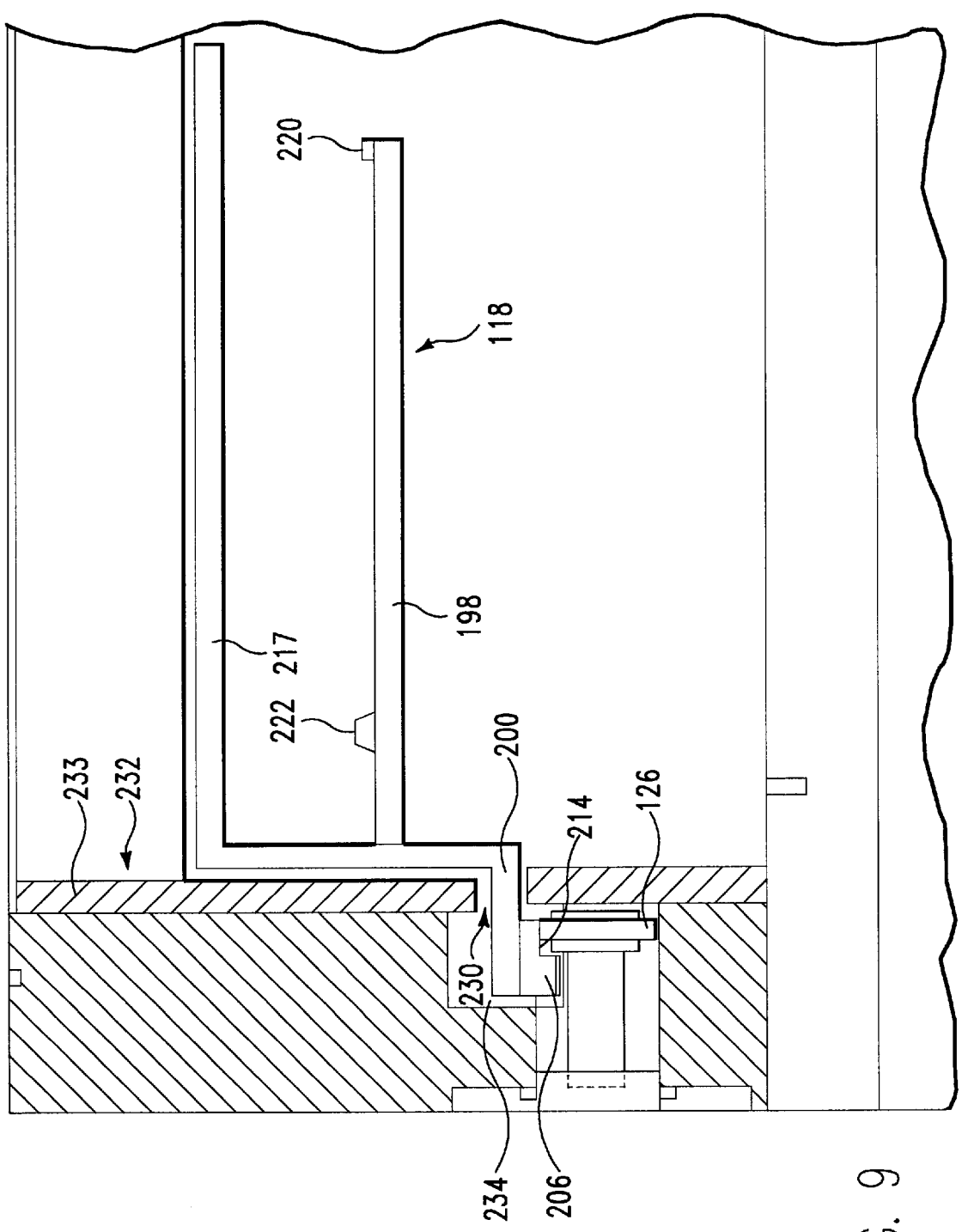
FIG. 9 is a partial schematic cross section of a chamber.

FIG. 9 is a partial schematic cross section of a chamber, showing the arrangement of rail 200 and track 123 or 125. An enclosed slot 230 may be positioned in an interior chamber wall 233 to allow rail 200 of shuttle 118 to extend into opening 234 of the interior wall. The inboard portion 214 of rail 200 may engage guide roller 126, such as on tracks 123 and 125 shown in FIG. 6. Slot 230 also reduces contamination caused by the guide rollers 126 by generally separating the processing environment from the components of tracks 123 and 125, which in turn reduces the likelihood that particles will flake off of the rail components and fall into a substrate processing region. Although not detailed herein, a similar arrangement may be provided for carrier 122 on track 124.

FIG. 10 is a schematic of another chamber cross section showing a pinion 128 engaged to a shuffle 118. The outside chamber walls are not shown in this schematic. A drive mechanism 240 includes a motor 242 external to the interior wall 233 of the particular chamber, such as entry load lock chamber 92, coupled to a drive shaft assembly 244 that extends into chamber 92. Motor 242 can be a reversible motor that can move shuttles and/or carriers in different directions. The motor can include one or more gear boxes that may be reversible. A drive shaft assembly 244 may be coupled to a first pinion 128 adjacent a first side 232 and a second pinion 128' adjacent a second side 232' of an associated chamber. The drive shaft assembly 244 may also be coupled to a first guide roller 126 disposed inboard of the first pinion 128 and to a second guide roller 126' disposed inboard of the second pinion 128'. Pinion 128 is configured to mesh with the toothed rack 206, and pinion 128' may be configured to mesh with toothed rack 208 of shuttle 118 and with similar racks on substrate carrier 122, as illustrated in FIG. 9. Drive mechanism 240 can also include an encoder 246 that provides input to a controller 248, responsive to the rotation of the drive shaft assembly 244. Controller 248 can connect one or more drive mechanisms 240 for sequenced or simultaneous operation of the drive mechanisms or some combination thereof.

FIG. 11 is a schematic of an alternative embodiment of the drive mechanism 240, shown in FIG. 10, in which motor 242 drives pinion 128 without the drive shaft assembly 244. A plurality of lateral guide rollers 249, 250 are mounted to the particular chamber adjacent guide rollers 126 on tracks 123 and 125, as shown in FIGS. 6–7. A similar arrangement can be provided for carrier 122 on track 124. The lateral guide rollers 249, 250 engage an upwardly extending guide rail 252 on shuttle 118 (or carrier 122) to ensure that the shuttle or carrier moves in an aligned lateral direction along their respective tracks. Guide rollers 126, 126' support the shuttle or the carrier. The guide rollers can be Teflon®-coated aluminum, Vespel®, or any other such material that does not significantly generate particulates and is soft for dampening vibrations.

Figure 12:
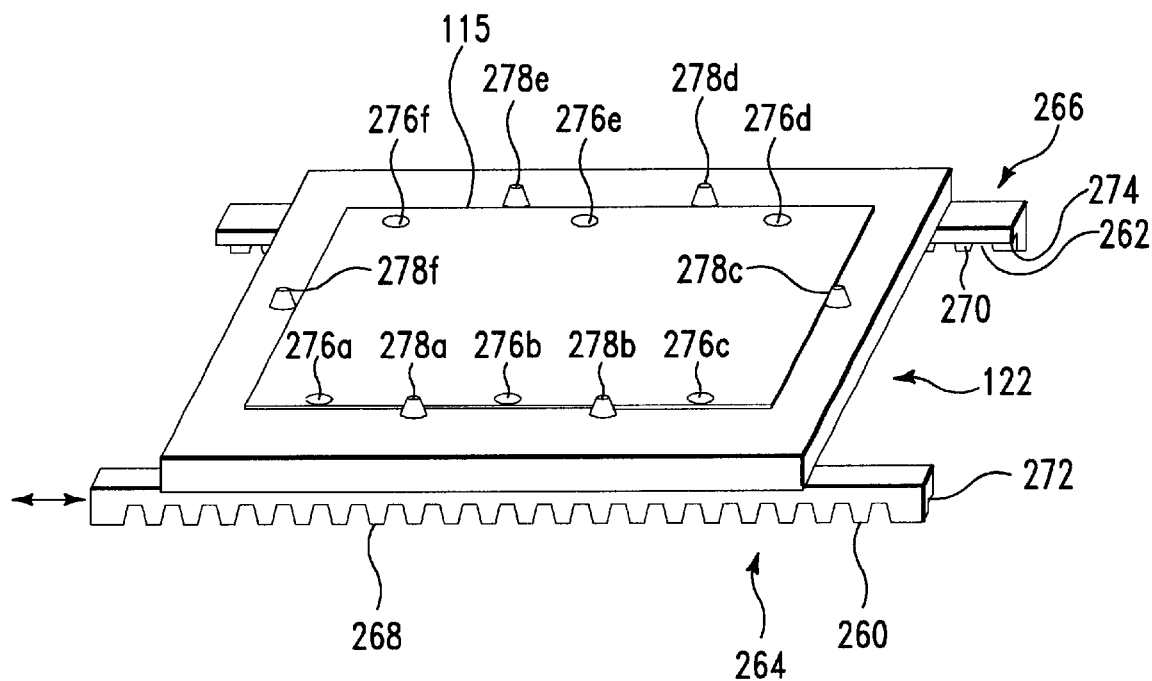
FIG. 12 is a schematic perspective view of a substrate carrier.

FIG. 12 is a schematic perspective view of a substrate carrier 122. Carrier 122 may be manufactured from a thermally conductive material, such as aluminum or copper, or from a bead blasted and/or anodized aluminum. Bead blasting surfaces of an object may increase the emissivity of the surfaces. Emissivity is generally defined as the ratio of radiation emitted from a surface relative to the radiation emitted from a black body at the same temperature. A high emissivity surface may be formed by a surface treatment that increases the emissivity relative to an untreated surface, such as by anodizing or bead blasting the surface, or a combination thereof. For example, a typical emissivity of an untreated aluminum surface is about 0.03 and is highly reflective. The surface emissivity will generally increase to a range of about 0.2 to about 0.4 by anodizing the surface or even higher to about 0.6 by bead blasting and anodizing the surface. Bead blasting may be accomplished, for example, by discharging approximately a 36 grit size garnet through a nozzle with an air pressure of approximately 80 pounds per square inch (psi) and impacting the aluminum surface until the aluminum appears to turn grayish in color. Other pressures, materials, and grit sizes may be used for bead blasting as is known in the art.

Carrier 122, as briefly discussed above, may include toothed rack 260 with teeth 268 and an inward stepped surface 269 on a first side 264, and a toothed rack 262 with teeth 270 and an inward stepped surface 267 on a second side 266. These tooth/rack combinations may form the drive engaging members noted above. Racks 260 and 262 are generally similar to racks 206 and 208 of transfer shuttle 118, as shown in FIG. 8, and engage guide rollers 126 and pinions 128 in a similar manner. Carrier 122 generally supports substrate 114 on a plate like surface and provides a heat sink for the substrate being supported thereon. A plurality of holes 276a–f (generally holes 276) are generally formed in carrier 122 for receiving pins 144 extending from pin plate 132, shown in FIG. 13, therethrough. Carrier 122 is generally slightly larger than substrate 114 and has guide stops 278a–f (generally guide stops 278) disposed thereon to retain substrate 114 laterally. Additionally, although not expressly included within the present invention, it is within the scope of the present invention to provide carrier 122 with a heating and/or cooling device for regulating the temperature of substrates positioned thereon. Further, although carrier 122 is described in the present exemplary embodiment as having a plate like surface with a plurality of bores formed therein for supporting substrates, other known configurations for supporting substrates are contemplated within the scope of the present invention.

In order to regulate the temperature of carrier 122 before, during, and/or after processing, a heating/cooling mechanism, such as the temperature controllable pin plate 132, may be provided in the process chamber adjacent each of load lock chambers 92 and 94. FIGS. 13a and 13b illustrate an exemplary pin plate 132 having either heating and/or cooling capabilities. During operation, pin plate 132 may be brought into contact with, or positioned immediately adjacent to, carrier 122 in order to selectively alter the temperature of carrier 118 and a substrate 114 positioned thereon. As a result of the change in carrier temperature, the temperature of the substrate supported thereon also changes. Pin plate 132 has a plurality of pins 144a–f (generally pins 144) disposed thereon extending upwardly from surface 282 of pin plate 132. Pins 144 are spaced in cooperation with holes 276 in carrier 122 so that pins 144 can pass therethrough. Assuming, for example, that the desired processing configuration necessitated cooling of pin plate 132, then pin plate 132 may be temperature controlled by providing a channel 284 formed in plate 132 through which a coolant such as water, glycol, or other suitable fluid may be passed. An inlet line 148 may deliver coolant to channel 284 and an outlet line 150 may provide a conduit for the coolant to be transported away from pin plate 132. Channel 284 may be formed, for example, by forming a portion of channel 284 in each of two plate halves. Thereafter, the individual halves may be sealed and/or fixed together forming a unitary plate and cooperatively forming channel 284. Alternatively, channel 284 may be formed by drilling through different sides and ends of pin plate 132 in order to create fluid passages. However, if the drilling method is employed, it is generally necessary to plug various exterior drill holes, thereby leaving an inlet to connect to an inlet line 148 and an outlet to connect to the outlet line 150. Also, surface 282 is preferably a high emissivity surface, such as a surface formed by bead blasting and/or anodizing, so that thermal transfer characteristics are enhanced.

When substrate 114 is raised by pin plate 132 in order to transfer substrate 114 between the carrier 122 and the shuttle 118, pin plate 132 generally makes physical contact with carrier 122, and therefore, lowers the temperature of the carrier 122. Alternatively, pin plate 132 can be used to heat carrier 122 by flowing a heated fluid through pin plate 132, as discussed above. By heating/cooling carrier 122, the temperature of substrate 114 is also raised or lowered to a desired temperature for optimal processing. The temperature may be monitored so that the duration of physical contact between pin plate 132 and carrier 122 for cooling or heating may be regulated to maintain a desired optimal processing temperature. Shaft 136 and lift motor 140, as shown in FIG. 7, can be used to raise and lowers pin plate 132 as the pin plate transfers the substrate between shuttle 118 and carrier 122. Pin plate 134 may be similarly manufactured and configured as pin plate 132.

Figure 14:
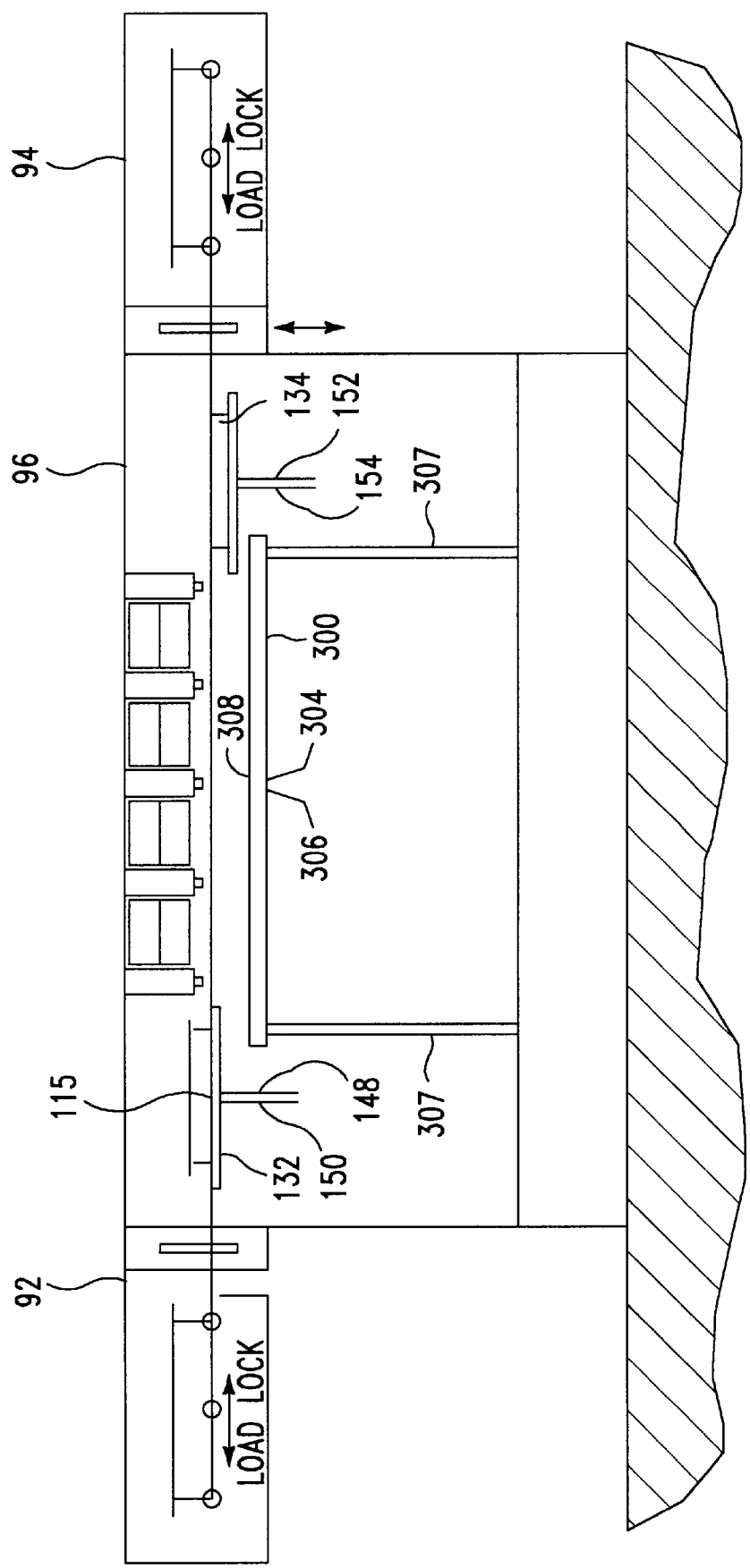
FIG. 14 is a schematic side view of another embodiment of the system shown in FIG. 6, having a temperature controllable plate.
Figure 15:
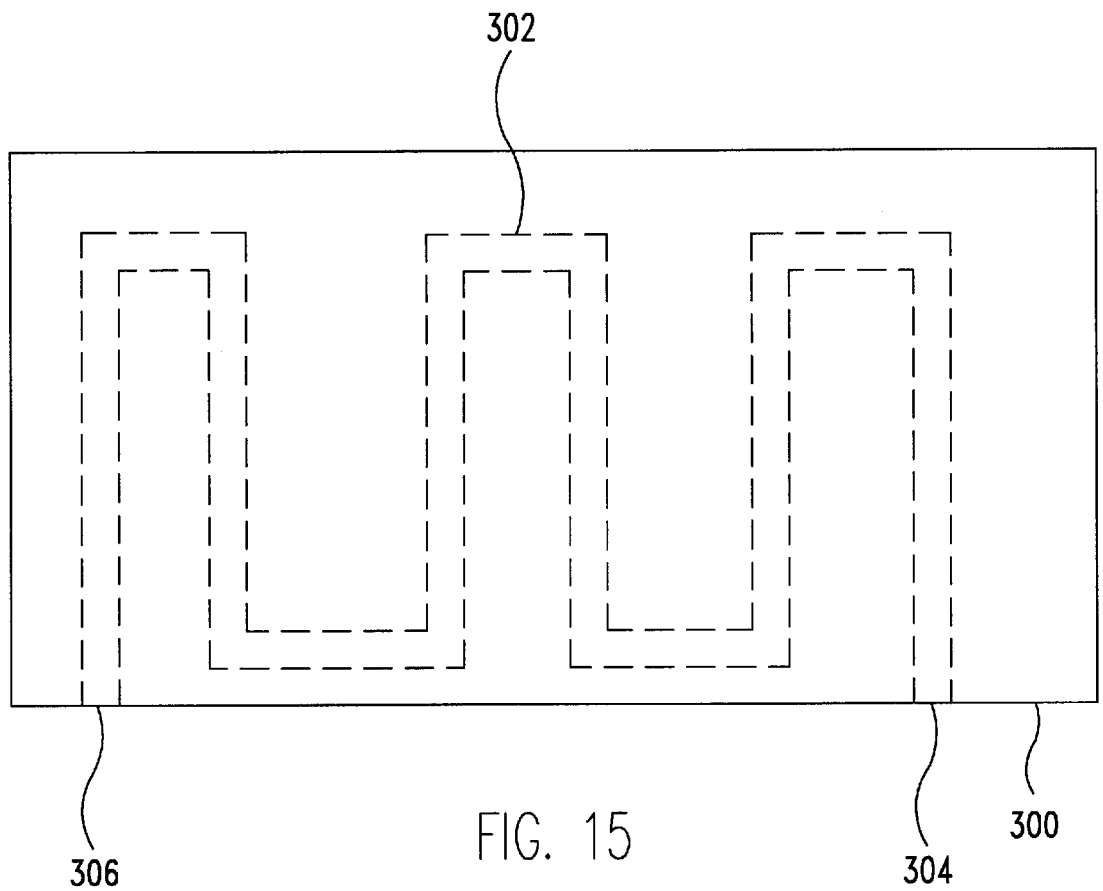
FIG. 15 is a schematic top view of the temperature controllable plate shown in FIG. 14.
Figure 16:
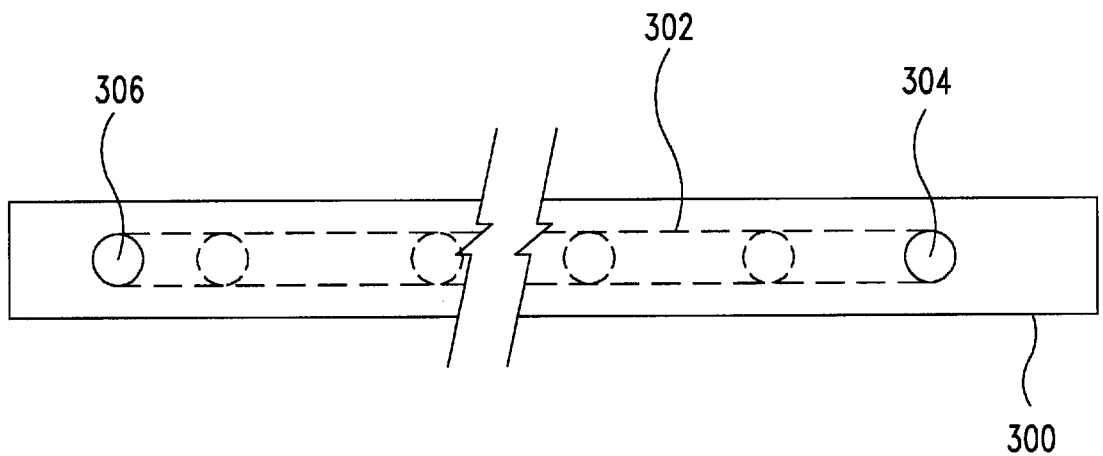
FIG. 16 is a schematic side view of the temperature controllable plate.

FIG. 14 is a side view of another exemplary embodiment of the consecutive deposition system shown in FIGS. 6–7. The system shown in FIG. 14 includes a plate 300 positioned below the general processing region of chamber 96. Plate 300 is similar in configuration to pin plate 132, as the temperature of plate 300 may be selectively regulated through a fluid passage and/or heating elements, as described with respect to pin plate 132. FIG. 15 illustrates an exemplary fluid channel 302 formed in plate 300, wherein channel 302 takes a non-linear path through plate 300, thereby increasing the thermal contact between fluid channel and plate 300. FIG. 16 illustrates a solid plate 300 having a plurality of holes formed therein in what is essentially a grid format, such that selected holes can be utilized to flow fluid into plate 300 and selected holes may be used to flow fluid out of plate 300. Any remaining holes should be plugged or otherwise sealed to maintain a closed system. Plate 300 is therefore cooled in like fashion as pin plates 132, but if desired, plate 300 may be heated. Plate 300, for example, can be rectangularly shaped and can be mounted in several locations, such as between sidewalls of processing chamber 96 or supported on a stand 307 that is connected to the bottom of the chamber. Plate 300 may include a fluid inlet 304 and a fluid outlet 306, both of which may be positioned on a side of the plate or from underneath the plate. Further, plate 300 may include resistive heating elements within plate 300, or alternatively, positioned proximate thereto for increasing the temperature of plate 300. Therefore, plate 300 may be configured to either raise or lower the temperature in processing chamber 96 by radiantly transferring and/or absorbing heat to/from various surfaces in the processing chamber. Plate 300 may also be used in cooperation with the cooled pin plates 132, 134 to control the temperature of the chamber, components within the chamber, and/or substrates being processed by the chamber. The high temperature surfaces of the chamber, such as a top portion 308 of the plate 300, may be treated to increase the emissivity properties thereof, through, for example, the bead-blasting or anodizing processes discussed above. An increase in emissivity generally assists in the transference of the radiant temperature of plate 300 to other surfaces inside the processing chamber 96, including a carrier 122 supporting a substrate 114. FIGS. 15 and 16 are exemplary top and side views of the plate 300, respectively. Plate 300 may have one or more channels 302 formed therein. In similar fashion to pin plates 132 and 134, channels 302 may be formed in two plates which are then joined together to complete the channel. Alternatively, channel 302 can be formed by drilling through various sides of plate 300, and thereafter, sealing portions of the channels at the plate sides to direct flow of a coolant through plate 300 to a fluid designated inlet and outlet.

Figure 17:
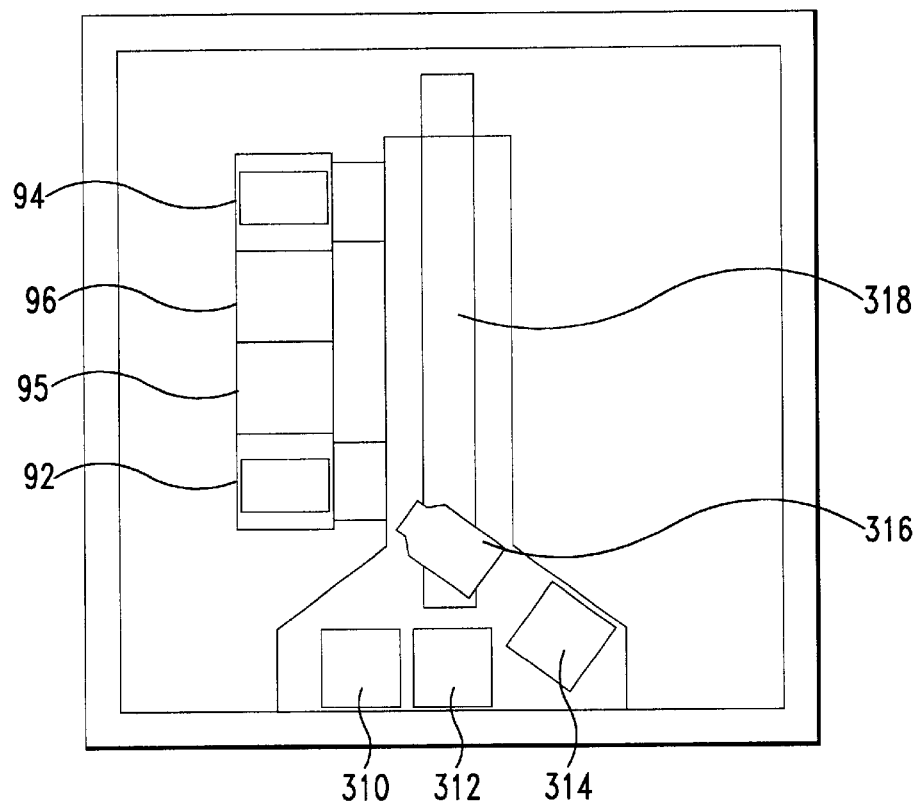
FIG. 17 is a top view diagram of a system having a pair of load lock chambers, processing chamber, and a robot.

The embodiments of the system shown in FIGS. 6–13 generally represent a single series of chambers. The invention can apply to multiple series of chambers disposed side-by-side or end-to-end with central receiving stations feeding the multiple series of chambers. Further, the present invention includes various substantially linear processing chamber configurations, and further, includes using a continuous loop configuration, such as, for example, a circle or oval type configuration. FIG. 17 is a top view diagram of a linear deposition system having an entry load lock chamber 92, processing chambers 95, 96, exit load lock chamber 94, and a robot. The system includes a unitary series of processing chambers 95, 96 coupled on one end to entry load lock chamber 92 and on another end to exit load lock chamber 94. Cassettes 310, 312, and 314 are disposed at one end of a track 318 which supports a track robot 316 operated at atmospheric conditions. Each load lock chamber is coupled to track robot 316. The system is similarly arranged as the series of chambers described in reference to FIGS. 6–13. Substrates are moved into the entry load lock chamber 92 by robot 316, transferred in to processing chambers 95, 96, processed, and retrieved from the exit load lock chamber 94 as described.

Figure 18:
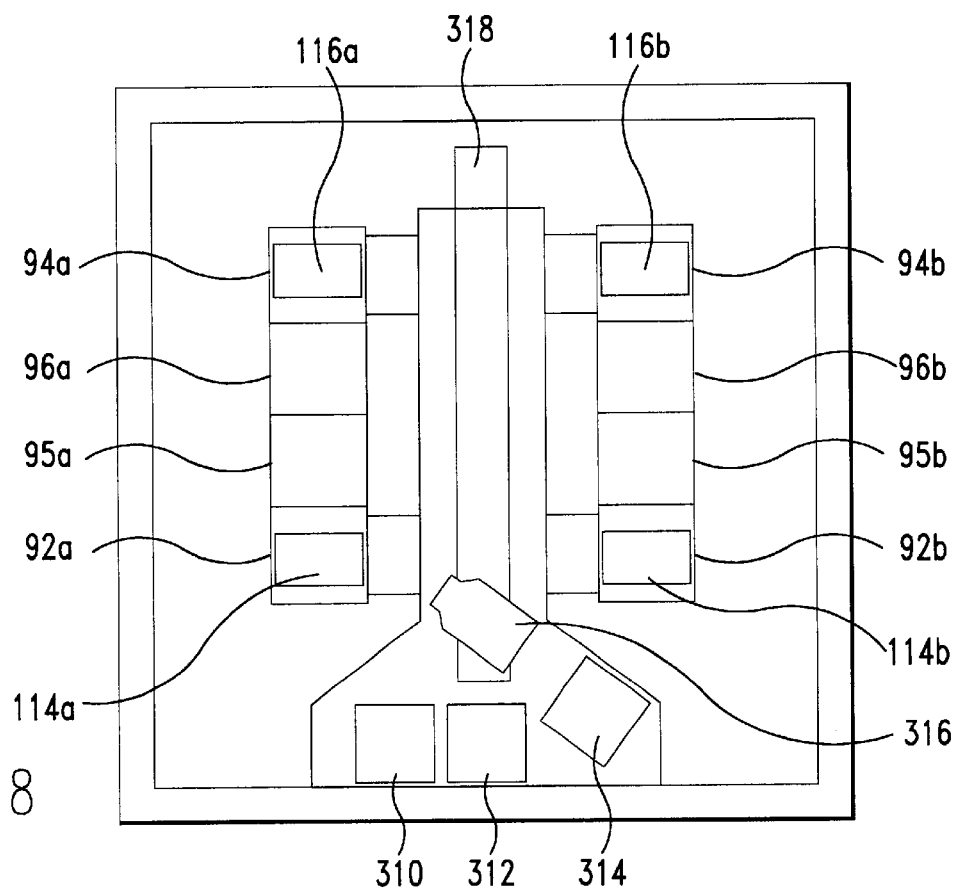
FIG. 18 is a top view diagram of a system having a two lines of chambers, each having two load lock chambers and a processing chamber with a robot disposed between the two lines.

FIG. 18 shows a variation of the system of FIG. 17 in which a bilateral series of chambers are coupled to a track robot 316. The first series of chambers includes processing chambers 95a, 96a to which one end is coupled to a first entry load lock chamber 92a and another end is coupled to a first exit load lock chamber 94a. The second series includes processing chambers 95b, 96b coupled on one end to a second entry load lock chamber 92b and coupled on another end to second exit load lock chamber 94b. The throughput rate can be increased by the robot 316 loading a first substrate 114a into the first entry load lock chamber 92a in the first series of chambers and a second substrate 114b loaded into the second loading load lock chamber 114b in the second series of chambers while the first substrate 114a is being processed. Similarly, the substrate 114a can be unloaded by the robot while the substrate 114b is being transferred from the processing chamber 96b into second exit load lock chamber 94b and awaiting removal by the robot 316. Depending on the timing and sequences in the chambers, other configurations could be possible, such as three or four series of chambers intersecting a central loading area with a robot.

Operation of Linear Deposition System

Generally referring to FIGS. 6 and 7, in operation, for example, a substrate 114 is delivered to entry load lock chamber 92 by a robot 110 through a valve 102 in entry load lock chamber 92. Robot 110 places substrate 114 on support fingers 198 disposed on a transfer shuttle 118. Robot 110 retracts from entry load lock chamber 92 and valve 102 closes. Entry load lock chamber 92 is brought to a vacuum of in the range of, for example, approximately 10 mTorr to 50 mTorr for CVD processing, and approximately 1 mTorr to 5 mTorr for PVD processing by a vacuum source (not shown). In some load lock chambers, the substrate 114 can also be heated/cooled to a predetermined processing temperature by heat lamps, resistive coils, endo/exothermic fluid flow devices, and/or other heating/cooling devices. Isolation valve 98 to processing chamber 96 is opened and shuttle 118 is moved along track 123 by pinion 128 rotatably engaging rack 204 on shuttle 118. A sensor (not shown) determines the position of shuttle 118 and provides input to a controller 248 configured to regulate shuttle movement.

Inside processing chamber 96, carrier 122 is positioned over pin plate 132 by moving carrier 122 with pinion 128 rotatably engaging rack 260 on carrier 122. Shuttle 118 is brought into position over and aligned with carrier 122 and pins 144 from pin plate 132. A lift motor 140 lifts shaft 136 that in turn raises pins 144 of pin plate 132 into contact with carrier 122. Pins 144 extend upward and through holes 276 in carrier 122, and therefore, lift the substrate from support fingers 198 on shuffle 118 supporting the substrate. Upon full extension of pins 144 through carrier 122, carrier 122 itself is engaged by a supporting surface of pin plate 132, and therefore, carrier 122 is also lifted by pin plate 132. Shuttle 118, having both carrier 122 and substrate elevated by pin plate 132, is then retracted into entry load lock chamber 92 and isolation valve 98 closes, thereby sealing processing chamber 96 having substrate 114 therein. Lift motor 140 lowers shaft 136 and pin plate 132, thus lowering pins 144 supporting substrate 114. Substrate 114 therefore contacts a supporting surface on carrier 122, and pins 144 continue lowering until the pins are lowered at least below carrier 122. Carrier 122 can then be moved along track 124 by pinion 128 engaging rack 260 on carrier 122 with sensors (not shown) sensing the carrier position and providing input for controller 248. Guide rollers 126 contact carrier 122 as it moves along track 124 and assists in maintaining alignment of carrier 122 along track 124. Alternatively, pins 144 could be separated from pin plate 132 and raised and lowered independently of pin plate 132 by, for example, using another lift motor (not shown) coupled to the pins. With a separation of the pins from the pin plate, the pin plate can contact the carrier longer while the pins raise and lower the substrate. Further, during the time period in which pin plate 132 is in contact with carrier 122, pin plate 132 can be transferring and/or receiving heat to/from carrier 122 through the use of the heating and/or cooling structures discussed herein.

Carrier 122 is then generally transferred into position for processing. For example, if the processing includes sputtering, carrier 122 is moved into position under at least one of targets 156, 158, 160, and 162. Power is supplied to the targets to bias the targets and a plasma is created. Ions from the plasma impact the targets and dislodge material from the targets. Some of the dislodged material travels in a path toward the substrate 114 and is deposited thereon. Partitions 171, 173, 175, 177, and 179 assist in isolating the particular target being sputtered from adjacent processing zones and/or other targets. The leading edge of substrate 114 is moved to the next processing zone in the series of processing zones 172, 174, 176, and 178, such as another processing zone having a target made of a different material. Power is supplied to the target in the next processing zone, the target is sputtered, and target material is deposited over the previously deposited material. The processing continues through the series of processing zones 172, 174, 176, and 178, as necessary, until the substrate has been processed with the regime(s) for the particular processing chamber 96. As described herein, the processing zones are not required to be the same or greater size as the substrate being processed, as the present invention allows the substrate to simultaneously move through multiple processing zones. Once the substrate has passed through the processing zones, carrier 122 is moved into position above, and aligned with, pin plate 134 disposed adjacent exit load lock chamber 94. Alternatively, if another processing chamber is coupled in series with processing chamber 96, the carrier can be moved into the next chamber or the substrate can be transferred to another carrier in the next processing chamber. Pin plate 134 is raised, pins 146 may be extend through carrier 122, thereby lifting substrate 114 above carrier 122. A transfer shuttle 120 in exit load lock chamber 94 is moved along track 125 from exit load lock chamber 94 through an isolation valve 100 between exit load lock chamber 94 and processing chamber 96. This movement positions shuttle 120 generally below carrier 122 with fingers 198 disposed below raised substrate 114. A motor 142 lowers pins 146 which lowers substrate 114 onto fingers 198 of shuttle 120. Shuttle 120 moves back through isolation valve 100 into exit load lock chamber 94 and isolation valve 100 closes to again seal the processing chamber. Exit load lock chamber 94 may provide cooling for the substrate before opening a valve 104 to allow a robot 112 to retrieve substrate 114 for further processing. A plurality of substrates can be disposed in the chambers simultaneously, such as substrate 114 in entry load lock chamber 92 awaiting transfer to carrier 122, substrate 114 being processed in process chamber 96, and substrate 114 awaiting transfer out of exit load lock chamber 94.

Carrier 122 may then be moved back along the track 124 toward entry load lock chamber 92 into position for another substrate from entry load lock chamber 92. Alternatively, the processing system of the present invention may be configured to be a continuous processing chamber, wherein, for example, the processing chamber includes a plurality of linear chambers arranged to form a continuous loop. It should be noted that carrier 122, in the present exemplary embodiment, remains within processing chamber 96, or at least under processing pressures, during the entirety of the processing operation. As such, carrier 122 not subject to the outgassing and contamination disadvantages of previous processing systems. Alternatively, if the process chamber sequence enables flexibility, each load lock chamber can serve as both loading and unloading load lock chambers. A substrate for processing can be placed on the carrier 122 from the exit load lock chamber 94 and moved back through the processing chamber 96 toward entry load lock chamber 92, where the substrate is then moved for loading into the loading load lock chamber. This type of configuration essentially generates a bi-directional processing chamber, wherein the end stations act as both loading and unloading stations for blind substrates as well a processed substrates, thereby increasing the efficiency of the processing apparatus.

Figure 1:
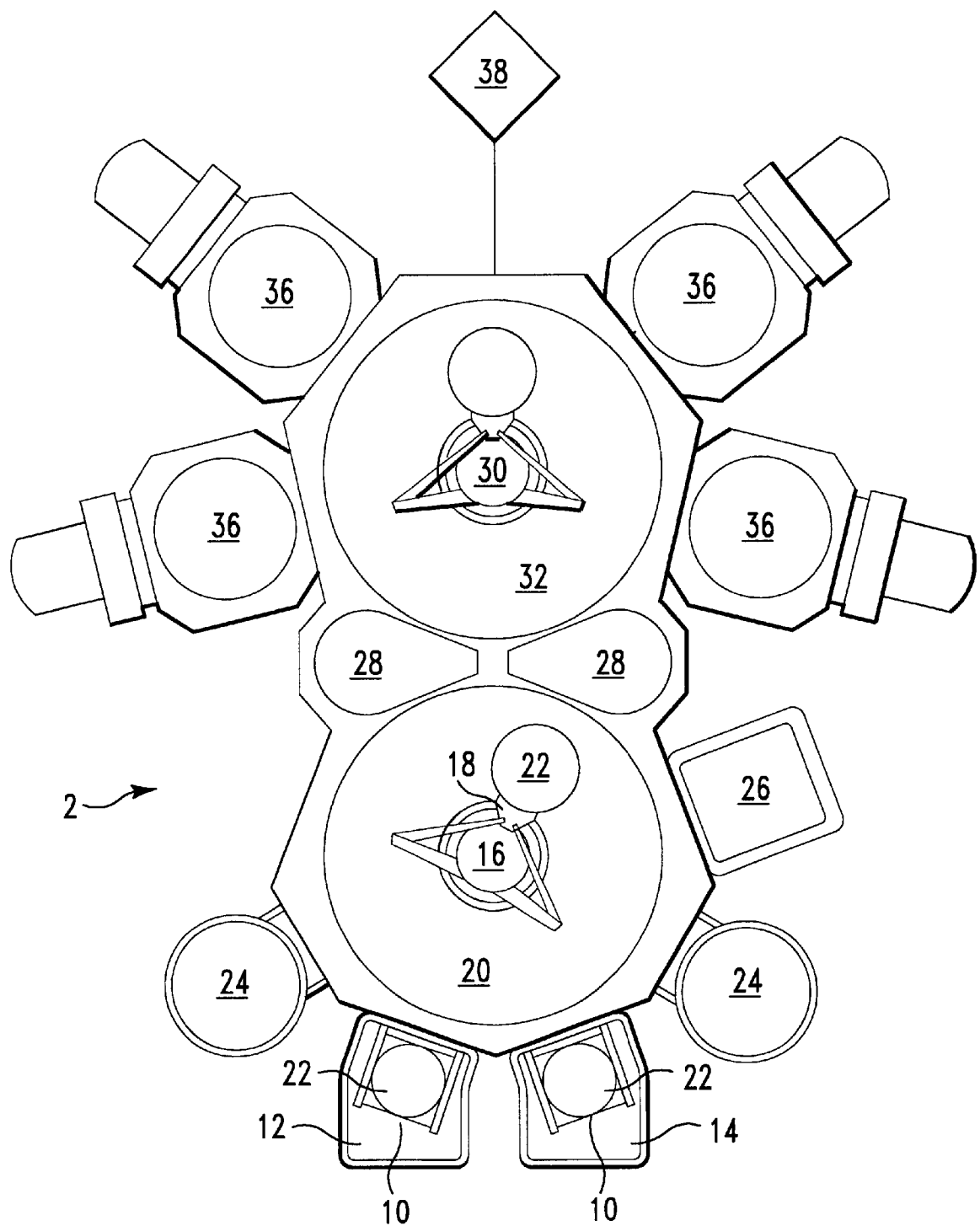
FIG. 1 is a schematic top view of a typical cluster tool system.
Figure 2:
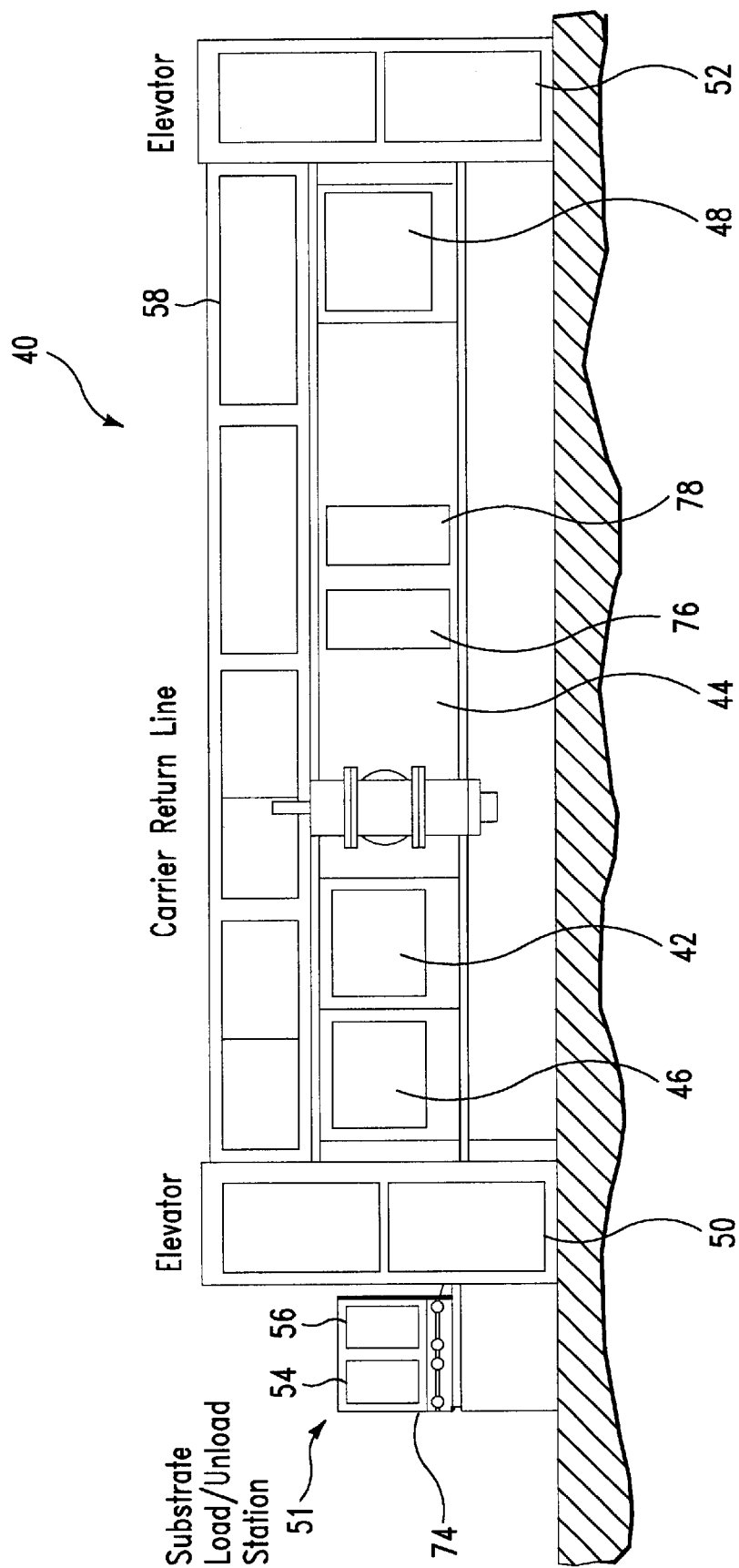
FIG. 2 is a schematic side view of a typical inline system.

As briefly noted above, carrier 122 generally does not leave the processing environment and is therefore, not subjected to varying temperature fluctuations, thermal cycles, and outgassing associated with exposure to ambient conditions. Therefore, carrier 122 has only limited exposure to contaminating environments, as discussed with regard to the system shown in FIG. 2. Shuttles 118 and 120 are positioned briefly in processing chamber 96, but principally retained in the respective load lock chambers 92, 94, and therefore, do not receive the depositions of material or other processing results that carrier 122 receives. Thus, the present invention provides a separation of the different support components into those components that are at least principally, and generally wholly, retained in the processing environment, and those components that are at least principally retained in a non-processing environment. The present invention also assists in controlling the temperature of the carrier retained in the processing environment by intermittently contacting a temperature controllable plate, such as between deposition cycles or when loading or unloading the substrates from and to shuttles, or by being in proximity to the plate so as to affect the carrier temperature. In particular, the carrier may be cooled by the temperature controllable plate to avoid the average temperature of the carrier from "creeping" upward due to the heat of the substrate processing, and alternatively, the carrier may be heated in order to bring the substrate up to a desired processing temperature. In either case, the temperature control features of the present invention are generally utilized to generate a consistent processing environment, which in turn produces more uniform films.

First Example Process—ITO/MoCr/MoCr Sputtered Deposition

The processing system of the present invention can be used on a wide variety of processes with differing materials and process regimes. The following example merely illustrates one possibility in using reactive and non-reactive processing zones, represented schematically in the side views of FIGS. 19–23. One substance currently being deposited on glass substrates for flat glass panels is indium tin oxide (ITO). One or more molybdenum chromium (MoCr) layers are typically deposited over the ITO layer. Other examples of typical materials for flat glass substrates include Cr, ITO, CrO, Ta, and Al.

A substrate may be loaded onto shuttle 118 in entry load lock chamber 92, a vacuum created in entry load lock chamber 92 of about 1 mTorr to about 50 mTorr, and shuttle 118 may move substrate 114 into the processing chamber 96.

Figure 19:
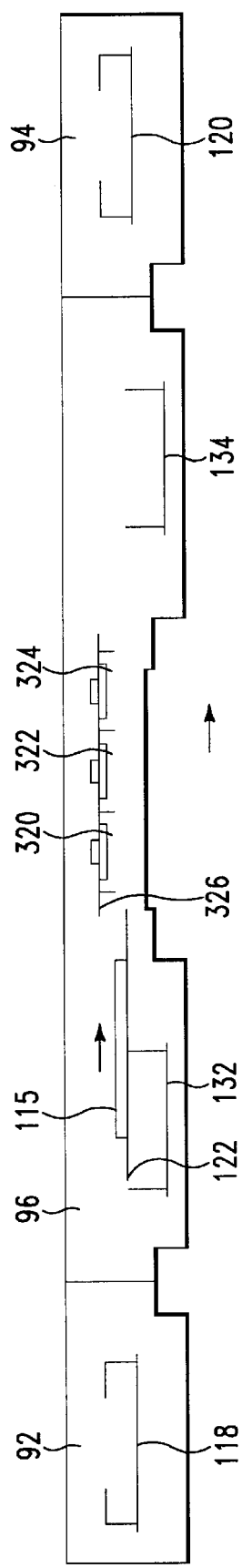
Figure 20:
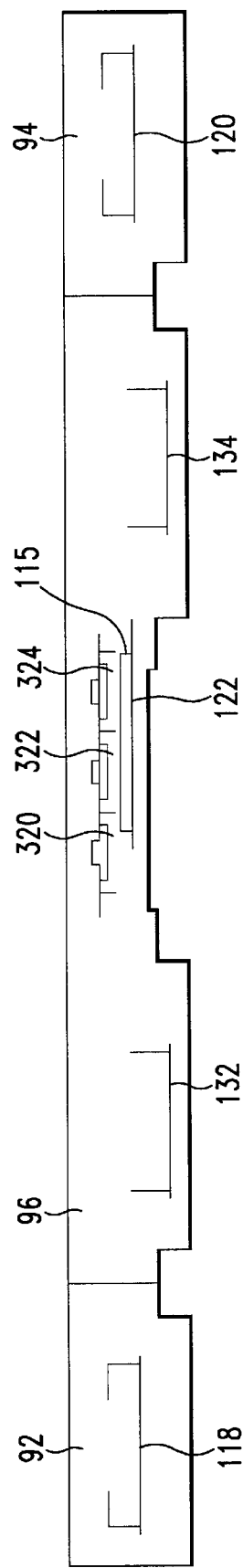

The substrate 114 may be transferred to carrier 122 positioned over pin plate 132, shuttle 118 returned to entry load lock chamber 92, and pin plate 132 lowered. As shown in FIG. 19, carrier 122 may move substrate 114 into a processing position under first processing zone 320 containing an ITO target 326. Argon or other inert gases may be introduced into the processing zone at the rate of about 34 standard cubic centimeters (sccm), to stabilize the process and assist in evacuating the first processing zone of contaminants. Diatomic oxygen may also be introduced into the first processing zone at a rate of about 0.17 sccm. About 2000 watts may be applied to the ITO target 326 positioned above or adjacent the substrate 114, a plasma created as a result thereof, and the ITO target 326 sputtered to produce an ITO layer thickness of about 500 Å on the substrate in about 40 seconds. As represented in FIG. 20, due to the size of the substrate 114, carrier 122 may need to move a portion of substrate 114 past second processing zone 322 and third processing zone 324 in order to finish processing of substrate 114 in the first processing zone 320.

Figure 21:
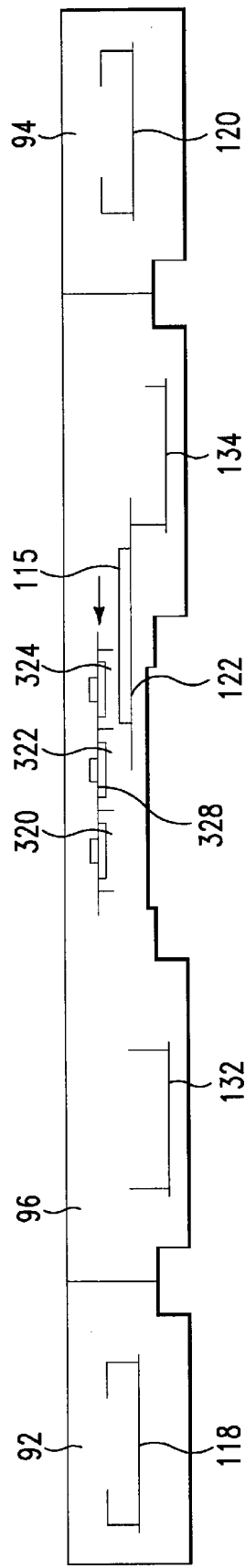

As represented in FIG. 21, the substrate 114 may be moved to second processing zone 322 which can be adjacent the first processing zone or remote from the first processing zone. Due to the size of the substrate and the proximity of the first processing zone to the second processing zone in the present exemplary embodiment, the carrier direction may be reversed to move the substrate 114 into alignment with the second processing zone 322. Alternatively, the second processing zone 322 may be activated for deposition as substrate 114 simultaneously moves through the first processing zone 320. In this example, the second processing zone 322 may include a MoCr target 328. To deposit other materials, corresponding targets of like material could be used, including for example, Cr, ITO, Ta, and Al targets with and without oxidizing and other reactant gases. A reactive process may be used to produce an oxidized layer of sputtered MoCr on substrate 114 to promote adhesion between the deposited ITO layer and subsequent layers. Argon or other inert gases are generally introduced into the second processing zone 322 at the rate of about 30 sccm. Diatomic oxygen may also be introduced into the second processing zone 322 at a rate of about 30 sccm to provide a reactive gas to react with the MoCr sputtered material and produce the oxidized adhesion layer of MoCrO. About 1000 watts may be applied to the MoCr target 328 positioned above the substrate 114, a plasma created therefrom, and the MoCr target 328 sputtered in the presence of the oxygen to produce a MoCrO layer thickness of about 14 Å in about 4 seconds.

As represented in FIG. 22, the carrier 122 may again reverse direction and move substrate 114 into a position to be processed for another layer. In this example, a 2000 Å thick layer of MoCr in a non-reactive process may be deposited on the MoCrO layer. Both of the processing zones containing MoCr targets 328, 330 may be used for a higher throughput rate. Argon or other inert gases may be introduced into each processing zone at the rate of about 75 sccm. Substantially no oxygen is generally introduced into the second or third processing zones 322, 324 respectively. About 13000 watts may be applied to the each of the MoCr targets 328, 330 positioned above the substrate 114, a plasma was created in the processing zones 322 324 as a result of the power, and the MoCr targets 328, 330 sputtered for about 44 seconds to produce a MoCr layer thickness of about 2000 Å. As represented in FIG. 23, the substrate may be removed from the processing zones 320, 322, 324 to be transferred to exit load lock chamber 94 for further processing.

Poly Silicon Technology

Present manufacturing techniques generally utilize either amorphous silicon technology or poly silicon technology to manufacture devices such as liquid crystal displays (LCD's). Amorphous silicon technology is generally used to manufacture devices such as laptop and desktop type personal computer screens, while poly silicon technology is generally used to manufacture digital camera screens, viewcam screens, and cellular telephone type screens. Although amorphous silicon technology manufactured in a cluster tool configuration is generally known as a common technology for LCD type displays, this technology is disadvantaged with limited resolution characteristics, in similar fashion to known cathode ray tube (CRT) type displays. Alternatively, poly silicon based technology is known to produce sufficient resolution characteristics for nearly all types of displays. In particular, poly silicon based techniques appear to be desirable for creation of large flat panel displays. However, present manufacturing and processing techniques are not conducive for manufacture of large flat panel displays using poly silicon techniques, as present processing chamber configurations are generally unable to process a substrate of sufficient size to support a large flat panel type display. However, through the use of the novel structure and configuration of the present invention, larger substrates, and in particular, substrates of sufficient size to support large flat panel type displays, are able to be manufactured/processed in an in-line type processing chamber of the present invention.

In order to manufacture a poly silicon based film, a low hydrogen amorphous silicon film is generally required. Once this low hydrogen amorphous silicon film is generated, the film is then generally heated, such as by a light source of sufficient intensity and/or power to melt the film, to form the desired crystalline structure, which is commonly known as an annealing process. The light source generally used for such annealing processes for poly silicon films is an Xenon-Chlorine (XeCl) excimer laser. Present poly silicon techniques support positioning the XeCl excimer laser outside the primary processing chamber, as the use of the laser inside the chamber tends to skew the temperature characteristics of the processing chamber which can degrade film properties. However, positioning the annealing laser outside the processing chamber again creates the possibility that the processed film can be contaminated, as the film must now be transported to the annealing laser, which commonly includes exposing the film to the ambient atmosphere.

A conventional process for generating poly silicon films is illustrated in FIG. 24. Conventional poly silicon based technology processes deposit a first layer of $SiO_2$ via a chemical vapor deposition process. This first layer is relatively thick, generally around 3000 angstroms. A second layer is then deposited on top of the first $SiO_2$ layer, wherein the second layer is generally formed of amorphous silicon approximately 300 to 500 angstroms thick. However, prior to depositing the second layer, conventional techniques will generally transfer the substrate having the first layer applied thereto to a second deposition chamber. Upon completion of the deposition of the second layer, the multilayer film is then transported to a third chamber or tool for annealing, which generally includes exposure of the film to atmospheric conditions.

Figure 25:
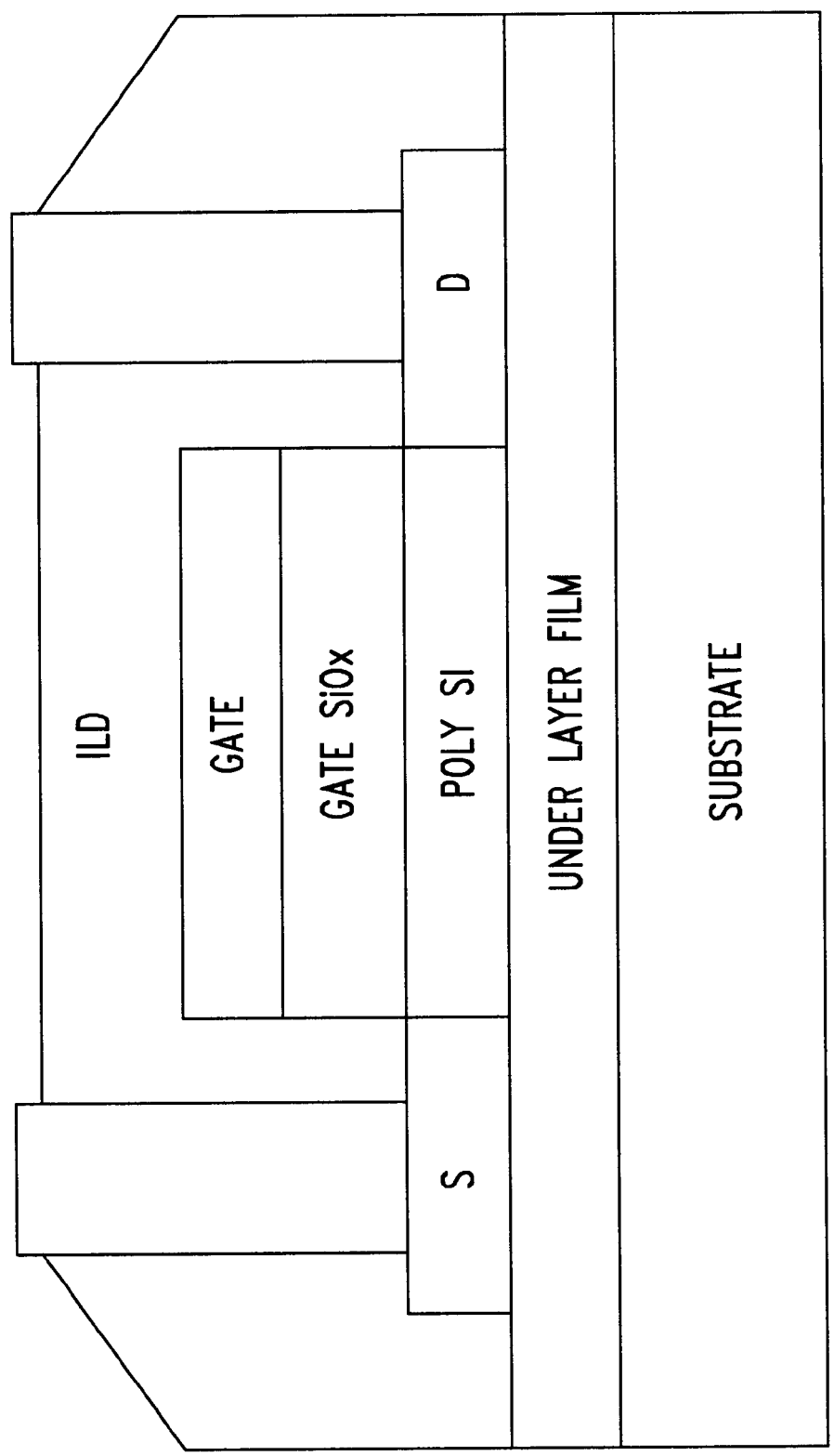
FIG. 25 illustrates a typical LCD TFT structure.

FIG. 25 illustrates a conventional poly silicon based film generally used to support a liquid crystal display thin film transistor (TFT) structure. The conventional film illustrated in FIG. 25 includes a base substrate 251 having a relatively thick under layer film 252 deposited thereon. This under layer film 252 generally corresponds to the 3000-angstrom thick first SiO₂ film illustrated in FIG. 24. mediately above the under layer film is a poly silicon layer 253, which may be, for example, approximately 300–500 angstroms thick. Immediately above the poly silicon layer is a gate SiOx layer 254, followed by a gate layer 255, as is known in the art. Additionally, an S doped region 257, which is the source of the transistor, and a D doped region 256, which is the drain of the transistor, are illustrated in FIG. 25 immediate poly silicon layer 253 and above under layer 252.

Through the use of embodiments of the processing system of the present invention, improved poly silicon based films may be manufactured. In particular, through the use of an inline processing system of the present invention wherein the annealing light source is positioned within the processing chamber, an improved poly silicon film may be produced, as the film need not be transported to an annealing station through atmospheric conditions from the processing chamber. The elimination of this transporting step through atmospheric conditions is critical, as exposure to atmospheric conditions is a primary source of contamination for poly silicon films. The improved poly silicon film, which is illustrated in FIG. 26, may include a base $SiO_2$ layer of approximately 3000 angstroms, which may be deposited through a physical vapor deposition process, for example. The second layer, that of an amorphous silicon layer of approximately 300–500 angstroms, for example, may also be deposited by a physical vapor deposition. The final step shown in FIG. 26, that of creating the poly silicon layer through annealing the amorphous silicon layer with an excimer laser, is generally conducted within the same chamber as the physical vapor deposition processes, as noted above.

Figure 27:
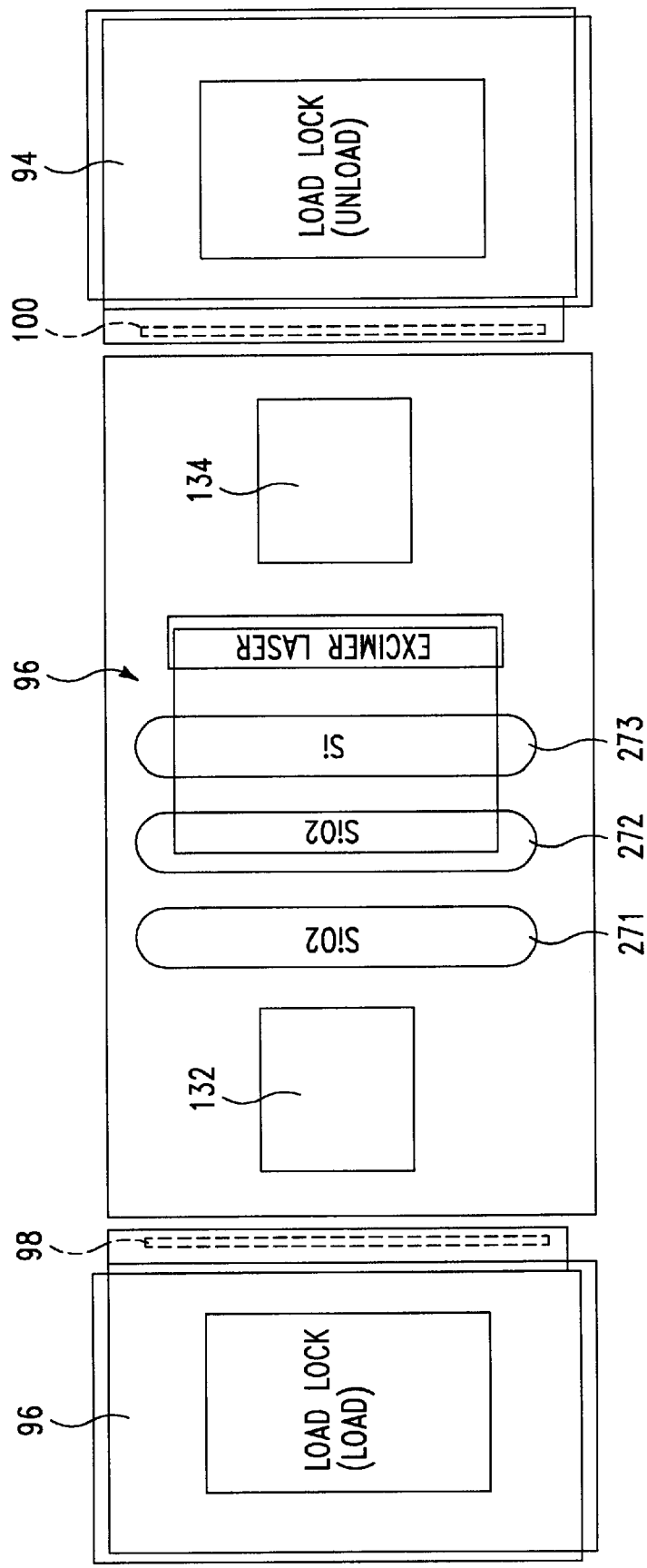
FIG. 27 illustrates a top view of an inline deposition system.

FIG. 27 illustrates an exemplary configuration of a deposition system of the present invention designed to produce the poly silicon film shown in FIG. 26. In this configuration, entry load lock chamber 92 is used to transfer at least one clean substrate from the ambient atmosphere/and or holding cassettes through entry load lock chamber 92 and valve 98 into processing chamber 96. The transfer is generally accomplished via shuttle 118, carrier 122, and plate 132, as described above. Therefore, the temperature of substrate 114 positioned on carrier 122 may first be regulated or controlled by plate 132 during the transfer of substrate 114 from shuttle 122 to carrier 118, as discussed above. Once substrate 114 begins to travel through the processing environment 96, it is no longer proximate plate 132, and therefore, it is generally outside of the physical area within which pin plate 132 is capable of controlling the temperature of substrate 114. Plate 300, however, which may be similar in construction to plates 132 and 134, may be positioned proximate the processing devices in chamber 96, and can therefore be used to regulate and/or control the temperature of substrate 114 during processing steps, as shown in FIG. 28. Plate 300 may be, for example, controlled to maintain a temperature in the range of 400° to 500° C., such that a silicone film can be easily converted to a poly silicone film during the excimer laser annealing stage of the present invention. Pin plate 134, which is proximate substrate 114 during the transfer from processing chamber 96 into exit load lock chamber 94, may be fluid cooled in order to control temperature of the substrate, carrier, and/or the ambient temperature during the exit of the substrate from chamber 96 into exit load lock chamber 94.

In the present exemplary poly silicon configuration, carrier 122, which is positioned immediately above plate 300, first passes substrate 114 under a first $SiO_2$ target 271 at a predetermined speed, where at least a portion of the 3000 angstrom under layer film is deposited on the substrate. Carrier 122 may then pass substrate 114 having at least a portion of the 3000 angstrom under layer film deposited thereon under a second $SiO_2$ target 272, where the remaining portion of the under layer may be deposited. Although a single target/deposition device may be used to deposit the under layer, cooperative use of two separate targets/deposition devices increases the working lifetime of the processing system, as the interval between target replacement is prolonged as a result of the sharing of target erosion between target 271 and target 272. Subsequent to second target 272 depositing the remaining portion of the under layer, a third target 273, which may be a pure silicon target, may be used to deposit a layer of amorphous silicon on top of the under layer. As noted in FIG. 26, this layer may be between approximately 300 and 500 angstroms. Upon completion of the deposition of the amorphous silicon layer, the substrate is then passed under an excimer laser 274 positioned within chamber 96. Laser 274 anneals the amorphous silicon film to form the desired poly silicon film. However, since the annealing process is contained within chamber 96, this process is prone to increasing the temperature in chamber 96. Therefore, as noted above, both pin plates 132 and 134, as well as plate 300 may be equipped with both heating and/or cooling devices, which allow for selective temperature control of chamber 96, as well as any substrates being processed therein. Upon completion of the annealing process, the substrate is transferred from chamber 96 into exit load lock chamber 94 via valve 100. Subsequently, the processed substrate may be removed from exit load lock chamber 94 by a robot or other known devices.

Although CVD processes may be used for generating the poly silicon films, CVD processes generally result in poor quality films as a result of the use of silane $SiH_4$ in the CVD processes, as the hydrogen released during CVD annealing processes does not contribute to the desired poly silicon film properties. Therefore, the exemplary deposition processes of the present invention focus upon PVD type processes, as PVD based annealing processes may use argon as the ambient gas, and therefore, eliminate introduction of hydrogen into the poly silicon film. For example, if an $SiO_2$ based target is used, as described above, then an RF bias of less than 1 kW may be applied to the target to initiate the PVD process. Using the $SiO_2$ target, for example, chamber pressure may be maintained in the range of approximately 1–5 mT and the flow of argon into the processing region may be 50–100 sccm with a substrate temperature of approximately 400°–500° C., while the DC power necessary to maintain steady deposition is generally less than 5 kW. Alternatively, a pure silicon target may be used to produce the $SiO_2$ layer, however, in using the pure silicon target oxygen is generally introduced into the processing zone as the ambient gas in order to generate the oxygen portion of the $SiO_2$ film. Similar temperatures, pressures, flow rates, and power settings to that utilized for the $SiO_2$ target may be used in conjunction with the pure silicon target.

FIG. 28 illustrates a side view of the exemplary apparatus shown in FIG. 27. Partitions 171, 173, 175, and 177, which operate to physically separate the respective deposition zones from each other, are shown in FIG. 28. Additionally, annealing zone partition 179, positioned between excimer laser 274 and unload lock valve 100, is shown. Magnets 281, or devices capable of generating comparable magnetic fields, are shown positioned above targets 271, 272, and 273. Magnets 281 operate to create a magnetic field proximate the exposed surfaces of targets 271, 272, and 273, which are generally known to increase sputtering rate and target life by encouraging even target erosion during the deposition processes.

Although the present invention has been described based upon the above noted embodiments, it would be apparent to those of skilled in the art that certain modifications, variations, and/or alternative constructions or configurations would be available, while remaining within the spirit and scope of the invention. In particular, variations in the orientation of structures such as, the shuttle, carrier, substrates, robot, chambers, targets and other system components are contemplated within the scope of the present invention. Additionally, all movements and positions referred to herein, such as "above", "top", "below", "under", "bottom", "side", and others are relative to positions of objects such as the targets, chambers, carriers and shuttles may be varied to create different configurations and embodiments. Accordingly, it is contemplated by the present invention to orient any or all of the components in various alternative orientations to achieve a desired movement of substrates through a processing system. Therefore, in order to determine the true scope of the present invention, reference should be made to the following claims.

What is claimed is:

1. An apparatus for processing at least one substrate, the apparatus comprising:
    at least one substrate carrier for transporting a substrate within a processing environment;
    at least one temperature controlled plate selectively in communication with the at least one substrate carrier; and
    at least one deposition device positioned proximate a processing path of the at least one substrate carrier in the processing environment, the at least one deposition device being configured to deposit a selected film upon the substrate.

2. The apparatus of claim 1, wherein the at least one substrate carrier further comprises:
    a substantially planar substrate receiving member, the receiving member having a plurality of bores formed therein and a substrate receiving surface formed thereon; and
    a drive engaging member positioned on a lower surface of the receiving member.

3. The apparatus of claim 1, wherein the at least one substrate carrier is configured to transport a substrate between a first point in the processing environment and a second point in the processing environment.

4. An apparatus for processing at least one substrate, comprising:
    at least one substrate carrier for transporting a substrate within a processing environment;
    at least one temperature controlled plate selectively in communication with the at least one substrate carrier, the at least one temperature controlled plate having at least one of a first heating device and a cooling device formed therein, and a plurality of elongated pin members extending from an engaging surface of the plate, the elongated members being configured to cooperatively engage a plurality of bores formed in the at least one substrate carrier; and
    at least one deposition device positioned proximate a processing path of the at least one substrate carrier in the processing environment, the at least one deposition device being configured to deposit a selected film upon the substrate.

5. The apparatus of claim 4, wherein the first heating device further comprises at least one heater in communication with a thermocouple.

6. The apparatus of claim 4, wherein the cooling device further comprises a fluid channel formed in the plate, the fluid channel having a fluid input and a fluid output.

7. The apparatus of claim 4, wherein the engaging surface further comprises at least one of a bead blasted surface and an anodized surface.

8. The apparatus of claim 1, wherein the apparatus further comprises a second heating device positioned within the processing environment for annealing the substrate.

9. The apparatus of claim 8, wherein the second heating device further comprises a laser light source.

10. The apparatus of claim 9, wherein the laser light source further comprises an excimer laser.

11. The apparatus of claim 1, wherein the at least one temperature controlled plate is in thermal communication with the at least one substrate carrier.

12. A method for processing at least one substrate, the method comprising:
    transporting a substrate into a processing environment on at least one substrate shuttle;
    transferring the substrate to a substrate carrier inside the processing environment;
    controlling the temperature of the substrate carrier with one or more temperature controlled plated;
    transporting the substrate carrier having the substrate thereon through at least one processing zone in the processing environment; and
    transferring the substrate from the substrate carrier to the at least one substrate shuttle for removal from the processing environment.

13. The method of claim 12, wherein transferring the substrate to a substrate carrier further comprises:
    positioning the at least one substrate shuttle above a selectively movable plate, the selectively movable plate having a plurality of elongated members extending therefrom;
    positioning the substrate carrier between the selectively movable plate and the at least one substrate shuttle, the substrate carder having a plurality of bores formed therein;
    elevating the selectively movable plate such that the plurality of elongated members extending therefrom cooperatively engage the plurality of bores formed in the substrate carrier and partially extend therethrough to engage and lift the substrate off of the at least one substrate shuttle;
    retracting the at least one substrate shuttle from the processing environment; and
    lowering the selectively movable plate such that the plurality of elongated members extending through the plurality of bores formed in the substrate carrier are retracted therefrom, thereby placing the substrate on the substrate carrier.

14. The method of claim 13, wherein controlling the temperature of the substrate carrier further comprises at least one of heating the selectively movable plate and cooling the selectively movable plate in order to transfer thermal energy between the selectively movable plate and the substrate carrier during contact therebetween.

15. The method of claim 14, wherein heating the selectively movable plate further comprises passing electrical energy through at least one resistive element heater positioned within the selectively movable plate.

16. The method of claim 14, wherein cooling the selectively movable plate further comprises passing a fluid through a fluid channel within the selectively movable plate.

17. The method of claim 12, wherein the step of transporting the substrate carrier through at least one processing zone further comprises moving the substrate carrier through a deposition zone and an annealing zone, wherein the film deposition zone and the annealing zone are both contained within the processing environment.

18. The method of claim 12, wherein transferring the substrate to the at least one substrate shuttle further comprises:
elevating a selectively movable plate to engage the substrate carrier, the selectively movable plate having a plurality of elongated members extending therefrom, the plurality of elongated members cooperatively engaging a plurality of bores formed in the substrate carrier and extending therethrough to elevate the substrate above the substrate carrier;
positioning the at least one substrate shuttle below the substrate;
lowering the selectively movable plate such that the plurality of elongated members extending therefrom retract from the plurality of bores formed in the substrate carrier, thereby lowering the substrate onto the at least one substrate shuttle; and
retracting the at least one substrate shuttle having the substrate thereon from the processing environment.

19. The method of claim 18, wherein elevating the selectively movable plate further comprises controlling the temperature of the substrate carrier while the selectively movable plate engages the substrate carrier.

20. The method of claim 19, wherein controlling the temperature further comprises at least one of heating the selectively movable plate and cooling the selectively movable plate in order to transfer thermal energy between the selectively movable plate and the substrate carrier during contact therebetween.

21. A method for forming a poly silicon film on a substrate, the method comprising:
loading a substrate into a processing environment;
exposing the substrate to at least one deposition source in the processing environment;
exposing the substrate to an annealing device in the processing environment; and
removing the substrate from the processing environment.

22. The method of claim 21, wherein the loading step further comprises the steps of:
placing the substrate on a shuttle in an entry load lock chamber;
creating a vacuum in the entry load lock chamber;
opening an isolation valve between the entry load lock chamber and the processing environment;
moving the shuttle into the processing environment;
transferring the substrate from the shuttle to a carrier in the processing environment;
retracting the shuttle into the load chamber; and
closing the isolation valve.

23. The method of claim 21, the method further comprising regulating the temperature of the substrate in the processing environment.

24. The method of claim 23, wherein regulating the temperature further comprises contacting a carrier having the substrate positioned thereon with a temperature controlled plate, the temperature controlled plate being configured to exchange thermal energy with the carrier.

25. The method of claim 24, wherein contacting the carrier further comprises at least one of passing a fluid through the temperature controlled plate to reduce the temperature thereof and passing an electrical current through at least one resistive heating device in the temperature controlled plate to increase the temperature thereof.

26. The method of claim 21, wherein exposing the substrate to at least one deposition source further comprises:
exposing the substrate to a first deposition source, the first deposition source being configured to deposit a silicon oxide film on the substrate;
exposing the substrate to a second deposition source, the second deposition source being configured to deposit a silicon oxide film on the substrate; and
exposing the substrate to a third deposition source, the third deposition source being configured to deposit an amorphous silicon film on the substrate.

27. The method of claim 26, wherein exposing the substrate to a first and second deposition sources further comprises depositing a cumulative silicon oxide film on the substrate, wherein the cumulative silicon oxide film has a thickness of about 3000 angstroms.

28. The method of claim 26, wherein exposing the substrate to a third deposition source further comprises depositing an amorphous silicon layer on the substrate, wherein the amorphous silicon layer has a thickness of at least 250 angstroms.

29. The method of claim 21, wherein exposing the substrate to an annealing device further comprises exposing the substrate to an excimer laser, the excimer laser being positioned within the processing environment.

30. The method of claim 21, wherein removing the substrate from the processing environment further comprises the steps of:
creating a vacuum in an exit load lock chamber;
opening an isolation valve between the exit load lock chamber and the processing environment;
moving a shuttle into the processing environment;
transferring the substrate from a carrier to the shuttle;
retracting the shuttle from the processing environment; and
closing the isolation valve.

31. An apparatus for transferring a substrate within a processing environment, comprising:
at least one substrate carrier for transporting a substrate within a processing environment having a plurality of bores formed therethrough; and
at least one temperature controlled plate having a plurality of elongated pin members engageable with the bores of the carrier.

32. The apparatus of claim 31, wherein the at least one substrate carrier is configured to transport a substrate between a first point in the processing environment and a second point in the processing environment.

33. The apparatus of claim 31, wherein the at least one temperature controlled plate further comprises a plate having at least one of a first heating device and a cooling device formed therein.

34. The apparatus of claim 33, wherein the first heating device further comprises at least one heater in communication with a thermocouple.

35. The apparatus of claim 33, wherein the cooling device further comprises a fluid channel formed in the plate, the fluid channel having a fluid input and a fluid output.

36. An apparatus for transferring a substrate within a processing environment, comprising:
at least one shuttle member having an open bottom;

at least one substrate carder having a plurality of bores formed therethrough; and at least one temperature controlled plate having a plurality of elongated pin members engageable with the bores of the carrier, whereby elevating the temperature controlled plate cooperatively engages the plurality of elongated members extending therefrom with the plurality of bores formed in the substrate carrier and at least partially extends the elongated members therethrough to engage and lift the substrate off of the at least one substrate shuttle.

37. The apparatus of claim 36, wherein the temperature controlled plate transfers a substrate disposed on the shuttle member to the substrate carrier within the processing environment.

38. The apparatus of claim 36, wherein the at least one substrate carrier is positionable between the shuttle member and the temperature controlled plate.

39. The apparatus of claim 36, wherein the plurality of elongated members extending through the plurality of bores formed in the substrate carrier are retractable therefrom, thereby placing the substrate on the substrate carrier.

40. The apparatus of claim 36, wherein the at least one temperature controlled plate comprises a plate having at least one of a first heating device and a cooling device formed therein.

41. The apparatus of claim 40, wherein the first heating device further comprises at least one heater in communication with a thermocouple.

42. The apparatus of claim 40, wherein the cooling device further comprises a fluid channel formed in the plate, the fluid channel having a fluid input and a fluid output.

43. An apparatus for transferring a substrate within a processing environment, comprising:

at least one shuttle member having the substrate disposed thereon:

at least one substrate carrier having a plurality of bores formed therethrough; and at least one temperature controlled plate for controlling a temperature of the substrate carrier when engaged therewith, the temperature controlled plate having a plurality of elongated pin members engageable with the bores of the carrier to transfer the substrate from the shuttle member to the carrier.

44. The apparatus of claim 43, wherein the at least one temperature controlled plate comprises a plate having at least one of a first heating device and a cooling device formed therein.

45. The apparatus of claim 43, wherein the temperature controlled plate is capable of transferring heat or removing heat from the substrate carrier when engaged therewith.

46. The apparatus of claim 43, wherein temperature controlled plate is engaged with the substrate carrier when the elongated pin members at least partially engage the bores of the carder.

* * * * *

UNITED STATES PATENT AND TRADEMARK OFFICE
CERTIFICATE OF CORRECTION

PATENT NO. : 6,460,369 B1
DATED : October 8, 2002
INVENTOR(S) : Akihiro Hosokawa It is certified that error appears in the above-identified patent and that said Letters Patent is hereby corrected as shown below:

Column 3,
Line 44, please change "though" to -- through --.

Column 6,
Line 12, please change "manufactures" to -- manufacturers --.
Line 41, please add -- as -- before "pinion".

Column 9,
Line 41, please add -- of -- after "operation".
Line 45, please add -- 91. -- after "..troller".
Line 64, please change "34" to -- 134 --.

Column 10,
Lines 27 and 52, please change "shuffle" to -- shuttle --.

Column 14,
Line 51, please change "shuffle" to -- shuttle --.

Column 19,
Line 1, please change "mediately" to -- Immediately. --.

Column 22,
Line 40, please change "carder" to -- carrier --.

Column 25,
Line 1, please change "carder" to -- carrier --.

UNITED STATES PATENT AND TRADEMARK OFFICE
CERTIFICATE OF CORRECTION

PATENT NO. : 6,460,369 B1
DATED : October 8, 2002
INVENTOR(S) : Akihiro Hosokawa It is certified that error appears in the above-identified patent and that said Letters Patent is hereby corrected as shown below:

Column 26,
Line 27, please change "carder" to -- carrier --.

Signed and Sealed this

Twenty-seventh Day of May, 2003

JAMES E. ROGAN
*Director of the United States Patent and Trademark Office*